(12) United States Patent
Kimura

(10) Patent No.: US 7,358,789 B2
(45) Date of Patent: Apr. 15, 2008

(54) LEVEL SHIFTER FOR DISPLAY DEVICE

(75) Inventor: Hajime Kimura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 32 days.

(21) Appl. No.: 11/282,469

(22) Filed: Nov. 21, 2005

(65) Prior Publication Data

US 2007/0034961 A1 Feb. 15, 2007

(30) Foreign Application Priority Data

Dec. 3, 2004 (JP) .............................. 2004-352102

(51) Int. Cl.
*H03L 5/00* (2006.01)
(52) U.S. Cl. ........................................ 327/333; 326/81
(58) Field of Classification Search ................ 327/333; 326/62, 63, 68, 80, 81
See application file for complete search history.

(56) References Cited

U.S. PATENT DOCUMENTS 5,646,642 A * 7/1997 Maekawa et al. .............. 345/99
5,748,026 A * 5/1998 Maekawa et al. ............ 327/333

FOREIGN PATENT DOCUMENTS

JP 06-216753 8/1994

* cited by examiner

*Primary Examiner*—Kenneth B. Wells
*Assistant Examiner*—William Hernandez
(74) *Attorney, Agent, or Firm*—Eric J. Robinson; Robinson Intellectual Property Law Office, P.C.

(57) ABSTRACT

A semiconductor device having a level shifter, a differential amplifier circuit, and the like, where power consumption is reduced by reducing an unnecessary through current and distortion of an output waveform can be suppressed. A gate terminal of the first transistor is a first input terminal and a gate terminal of a second transistor is a second input terminal. The gate terminal of the first transistor is connected to a source terminal of the second transistor. The gate terminal of the second transistor is connected to a source terminal of the first transistor.

10 Claims, 23 Drawing Sheets

LEVEL SHIFTER FOR DISPLAY DEVICE

TECHNICAL FIELD

The present invention relates to an art of a semiconductor device having an amplification function. More specifically, the invention relates to a semiconductor device having a circuit typified by a differential amplifier circuit, a sense amplifier, a level shifter, and the like. Further, the invention relates to a display device having these. In addition, the invention relates to an electronic device having the display device in a display portion.

BACKGROUND ART

In recent years, an integrated circuit (IC), which is widely used for a portable phone, a portable terminal, and the like and which has several hundreds of thousands to several millions of transistors and resistors formed over a silicon substrate having a size of about 5 mm square, has been playing an important role for downsizing and improving reliability of a device and for the mass production of the device.

In the case of designing a circuit used for an integrated circuit (IC) and the like, an amplifier circuit having a function to amplify a voltage or a current of a signal with small amplitude is designed. An amplifier circuit is used widely as an essential circuit for eliminating a distortion so that a circuit can operate stably.

Here, description is made on a differential amplifier circuit as an example of an amplifier circuit. A differential amplifier circuit is often used for a level shifter and an operational amplifier. Here, FIG. 6 shows a configuration example of a conventional level shifter and description is made on the configuration and operation thereof (see the conventional art of Patent Document 1: Japanese Patent Laid-Open No. 6-216753).

It is to be noted in this specification that each power source potential is referred to as VDD# and VSS# (# refers to a number). Here, VDD1, VDD2, VSS1, VSS2, and VSS3 are used and their levels are set to satisfy VSS3<VSS2<VSS1<VDD1<VDD2.

First, description is made on a configuration of a level shifter shown in FIG. 6(A). The level shifter shown in FIG. 6(A) shifts a high potential side while fixing a low potential side and outputs a signal with amplitude of a difference between a voltage level VSS1 and a voltage level VDD2 relatively to an input signal with amplitude of a difference between a voltage level VSS1 and a voltage level VDD1. This level shifter has the following configuration. A source region of a p-channel transistor 601 and a source region of a p-channel transistor 602 are both connected to a high potential power source (a power source potential VDD2). A gate electrode of the p-channel transistor 601 and a gate electrode of the p-channel transistor 602 are connected to each other and to a drain region of the p-channel transistor 602. A drain region of the p-channel transistor 601 is connected to a drain region of an n-channel transistor 603. A source region of the n-channel transistor 603 and a source region of an n-channel transistor are both connected to a low potential power source (a power source potential VSS1). Further, a first input signal in1 (a voltage thereof is expressed as Vin1) is inputted to a gate electrode of the n-channel transistor 603 and a second input signal in2 (a voltage thereof is expressed as Vin2) is inputted to a gate electrode of the n-channel transistor 604. It is to be noted that the second input signal in2 is an inverted signal of the first input signal in1. The drain region of the p-channel transistor 602 is connected to a drain region of the n-channel transistor 604, and an output signal out (a voltage thereof is expressed as Vout) is obtained from this node.

Next, description is made on a basic operation of the level shifter shown in FIG. 6(A). When a High signal is inputted as the first input signal in1, the n-channel transistor 603 becomes conductive and a drain potential thereof becomes VSS1. On the other hand, as the gate electrode and the drain region of the p-channel transistor 602 are connected to each other, the p-channel transistor 602 operates in a saturation region. Accordingly, a potential which is obtained by dividing a voltage between VDD2 and VDD1 by resistance of the n-channel transistor 604 and the p-channel transistor 602 is inputted to the gate electrode of the p-channel transistor 601. This potential is expressed as $V_{601}$. When the first input signal in1 is a High signal, the second input signal is a Low signal; therefore, the n-channel transistor 604 becomes non-conductive. Accordingly, the potential $V_{601}$ inputted to the gate electrode of the p-channel transistor 601 becomes higher in accordance with the power source potential VDD2. Therefore, the p-channel transistor 601 becomes non-conductive and a potential of the output signal out becomes VSS1.

When a Low signal is inputted as the first input signal in1, the n-channel transistor 603 becomes non-conductive. On the other hand, the second input signal becomes a High signal; therefore, the n-channel transistor 604 becomes conductive. Accordingly, the potential $V_{601}$ inputted to the gate electrode of the p-channel transistor 601 becomes lower in accordance with the power source potential VSS1. Therefore, the p-channel transistor 601 becomes conductive and a potential of the output signal out becomes VDD2.

In this manner, the input signal with amplitude of a difference between the voltage level VSS1 and the voltage level VDD1 is converted into an output signal with amplitude of a difference between the voltage level VSS1 and the voltage level VDD2.

Next, description is made on a configuration of a level shifter shown in FIG. 6(B). The level shifter shown in FIG. 6(B) shifts a low potential side while fixing a high potential side and outputs a signal with amplitude of a difference between a voltage level VSS3 and the voltage level VSS1 relatively to an input signal with amplitude of a difference between the voltage level VSS2 and the voltage level VSS1. This level shifter has the following configuration. A source region of an n-channel transistor 607 and a source region of an n-channel transistor 608 are both connected to a low potential power source (a power source potential VSS3). A gate electrode of the n-channel transistor 607 and a gate electrode of the n-channel transistor 608 are connected to each other and to a drain region of the n-channel transistor 608 and a drain region of a p-channel transistor 606. A drain region of the n-channel transistor 607 is connected to a drain region of a p-channel transistor 605. A source region of the p-channel transistor 605 and a source region of the p-channel transistor 606 are both connected to a low potential power source (a power source potential VSS1). Further, a first input signal in1 is inputted to a gate electrode of the p-channel transistor 605 and a second input signal in2 is inputted to a gate electrode of the p-channel transistor 606. It is to be noted that the second input signal in2 is an inverted signal of the first input signal in1. An output signal out is obtained from the drain region of the first p-channel transistor 605.

Next, description is made on a basic operation of the level shifter shown in FIG. 6(B). When a Low signal is inputted as the first input signal in1, the p-channel transistor 605 becomes conductive and a drain potential of the p-channel transistor 605 becomes VSS1. On the other hand, as the gate electrode and the drain region of the n-channel transistor 608 are connected to each other, the n-channel transistor 608 operates in a saturation region. Accordingly, a potential obtained by dividing a voltage between VSS1 and VSS3 by resistance of the p-channel transistor 606 and the n-channel transistor 608 is inputted to the gate electrode of the n-channel transistor 607. This potential is expressed as $V_{607}$. When the first input signal in1 is a Low signal, the second input signal becomes a High signal; therefore, the p-channel transistor 606 becomes non-conductive. Accordingly, the potential $V_{607}$ inputted to the gate electrode of the n-channel transistor 607 becomes lower in accordance with the power source potential VSS3. Therefore, the n-channel transistor 607 becomes non-conductive and a potential of the output signal out becomes VSS1.

When a High signal is inputted as the first input signal in1, the p-channel transistor 605 becomes non-conductive. On the other hand, the second input signal becomes a Low signal; therefore, the p-channel transistor 606 becomes conductive. Accordingly, the potential $V_{607}$ inputted to the gate electrode of the n-channel transistor 607 becomes higher in accordance with the power source potential VSS1. Therefore, the n-channel transistor 607 becomes conductive and a potential of the output signal out becomes VSS3.

In this manner, the input signal with amplitude of a difference between the voltage level VSS2 and the voltage level VSS1 is converted into an output signal with amplitude of a difference between the voltage level VSS3 and the voltage level VSS1.

DISCLOSURE OF INVENTION

Problems to be Solved by the Invention

A problem of the level shifters shown in FIG. 6 is described. It is to be noted that both of the level shifters shown in FIGS. 6(A) and 6(B) have a common problem; therefore, the level shifter shown in FIG. 6(A) only is taken as an example here.

When a High signal is inputted as the second input signal in2, the n-channel transistor 604 becomes conductive. Further, the p-channel transistor 602 always operates in a saturation region. As a result, a current flows between VDD2 and VSS1 through the p-channel transistor 602 and the n-channel transistor 604. This state continues unless the n-channel transistor 604 becomes non-conductive. As a current keeps flowing, the level shifter consumes more power.

Here, description is made with reference to FIG. 7 on the case where the second input signal in2 changes from a High signal to a Low signal. FIG. 7(A) shows the potential Vin2 of the second input signal in2 with the ordinate and a time passage of the second input signal in2. FIG. 7(B) shows the potential Vin1 of the first input signal in1 with the ordinate and the time passage of the first input signal in1 with abscissa. A gate-source voltage $Vgs_{604}$ of the n-channel transistor 604 is obtained by a following formula (1).

$$Vgs_{604} = Vin2 - VSS1 \quad (1)$$

Here, the time passage of $Vgs_{604}$ is shown in FIG. 7(C). In particular, in the case where the second input signal in2 changes from a High signal to a Low signal over a long time, Vin2 eventually decreases from VDD1 to VSS1. Therefore, it takes additional time until $Vgs_{604}$ becomes a level of a threshold voltage $Vth_{604}$ of the n-channel transistor 604 or lower. That is, it takes more time than required until the n-channel transistor 604 becomes non-conductive. Accordingly, an additional current flows between VDD2 and VSS1 through the p-channel transistor 602 and the n-channel transistor 604. As a result, power consumption of the level shifter is increased. Further, due to the additional current, an output waveform is distorted.

Further, similarly in the case where the second input signal in2 changes from a Low signal to a High signal and the case where the signal changes from the Low signal to the High signal over a long time, Vin2 eventually increases from VSS1 to VDD1. Therefore, it takes additional time until $Vgs_{604}$ which is as high as a threshold voltage $Vth_{604}$ of the n-channel transistor 604 or higher reaches VDD1. That is, it takes more time than required until the n-channel transistor 604 becomes conductive. Accordingly, an additional current flows between VDD2 and VSS1 through the p-channel transistor 602 and the n-channel transistor 604.

Therefore, it is an object of the invention to provide a semiconductor device where no additional current flows even in the case where an input signal changes from a High signal to a Low signal or from a Low signal to a High signal over a long time as described above and where power consumption can be reduced and distortion of an output waveform can be suppressed.

Means for Solving the Problems

In view of solving the aforementioned problems, a semiconductor device as described below is suggested in the invention.

A semiconductor device of the invention includes a first transistor having a gate electrode to which a first signal is inputted and a first terminal to which a second signal is inputted, a second transistor having a gate electrode to which a second signal is inputted and a first terminal to which a first signal is inputted, a third transistor having a first terminal to which a predetermined potential is inputted and a second terminal connected to a second terminal of the first transistor, and a fourth transistor having a gate electrode connected to a gate electrode of the third transistor, a first terminal to which a predetermined potential is inputted, a second terminal connected to a second terminal of the second transistor, and the gate electrode and the second terminal of which are connected to each other.

A semiconductor device of the invention with another configuration includes a first transistor, a second transistor, a third transistor, and a fourth transistor. A gate electrode of the third transistor is connected to a gate electrode of the fourth transistor. A first terminal of the third transistor is connected to a first wire. A first terminal of the fourth transistor is connected to a second wire and a second terminal of the fourth transistor is connected to the gate electrode of the fourth transistor. A gate electrode of the first transistor is connected to a third wire, a first terminal of the first transistor is connected to a fourth wire, and a second terminal of the first transistor is connected to a second terminal of the third transistor. A gate electrode of the second transistor is connected to the fourth wire, a first terminal of the second transistor is connected to the third wire, and a second terminal of the second transistor is connected to the second terminal of the fourth transistor.

For example, a gate terminal of the first transistor is used as a first input terminal and a gate terminal of the second transistor is used as a second input terminal. The gate terminal of the first transistor is connected to the source terminal of the second transistor. Further, the gate terminal of the second transistor is connected to a source terminal of the first transistor.

In the aforementioned configuration, a semiconductor device with another configuration includes the third wire connected to the gate electrode of the third transistor through a first level shifter and the fourth wire is connected to the gate electrode of the fourth transistor through a second level shifter circuit.

In the aforementioned configuration, a semiconductor device with another configuration includes the third wire to which a first input signal is inputted and the fourth wire to which a second input signal is inputted.

In the aforementioned configuration, a semiconductor device with another configuration includes the first transistor and the second transistor which are the same first conductive type, and the third transistor and the fourth transistor which are the same second conductive type.

It is to be noted that it is difficult to distinguish between a source region and a drain region of a transistor due to a structure thereof. Further, potential levels may be interchanged depending on a circuit operation. Therefore, the source region and the drain region are not specified here and described as a first terminal and a second terminal. For example, in the case where the first terminal is a source region, the second terminal corresponds to a drain region. On the contrary, in the case where the first terminal is a drain region, the second terminal corresponds to a source region.

There are an n-channel type and a p-channel type as conductive types of a transistor, which are described as a first conductive type and a second conductive type in this specification unless conductivity thereof is especially specified. For example, in the case where a first conductive type transistor is an n-channel transistor, a second conductive type corresponds to a p-channel type. On the contrary, in the case where a first conductive type transistor is a p-channel transistor, a second conductive type corresponds to an n-channel type.

It is to be noted that a connection in the invention means an electrical connection. Therefore, in the configuration disclosed in the invention, another element (for example, a transistor, a diode, a resistor, a capacitor, a switch, and the like) which enables electrical connection may be provided in addition to a predetermined connection.

Effect of the Invention

According to a semiconductor device of the invention, a current can be reduced even when an input signal changes over a long time and additional power consumption can be reduced, and at the same time, distortion of an output waveform can be suppressed.

BEST MODE FOR CARRYING OUT THE INVENTION

Although the invention will be fully described by way of embodiment modes with reference to the accompanying drawings, it is to be understood that various changes and modifications will be apparent to those skilled in the art. Therefore, unless otherwise such changes and modifications depart from the scope of the invention, they should be construed as being included therein.

EMBODIMENT MODE 1

Figure 1:
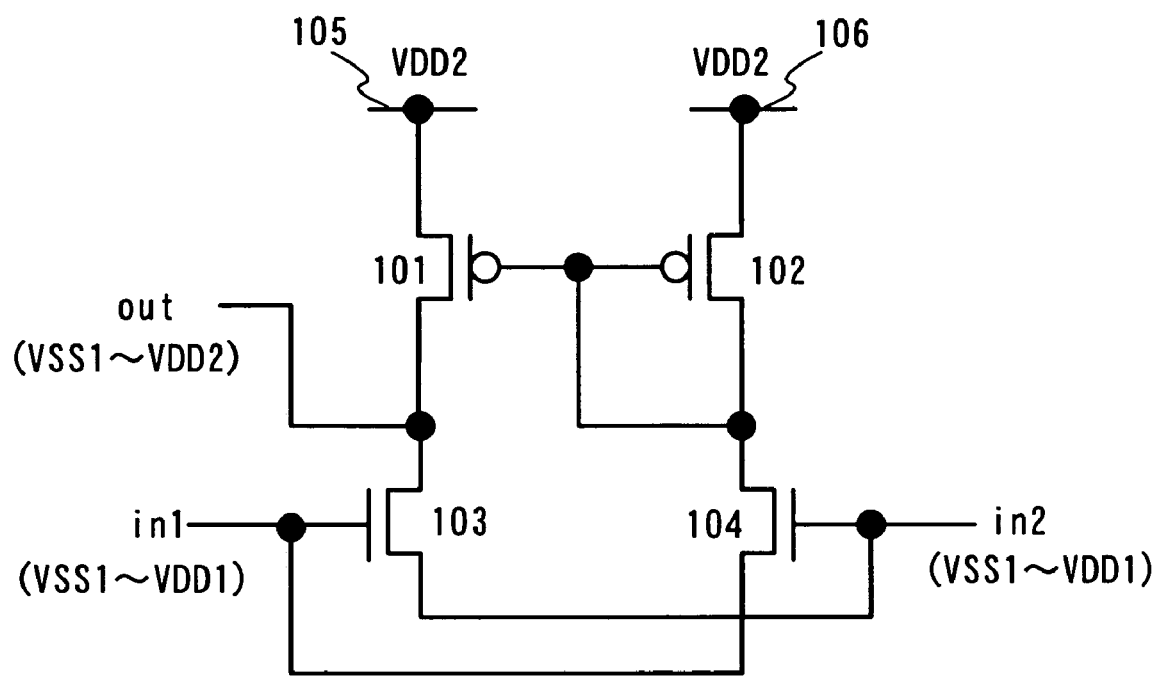
FIG. 1 shows a circuit diagram showing an example of a level shifter described in Embodiment Mode 1.

First, description is made with reference to FIG. 1 on a basic configuration of a semiconductor device of this embodiment mode.

FIG. 1 is a circuit diagram of a semiconductor device of this embodiment mode. The semiconductor device of this embodiment mode has a following configuration. A source region of a p-channel transistor 101 is connected to a first wire 105. A source region of a p-channel transistor 102 is connected to a second wire 106. Gate electrodes of the p-channel transistor 101 and the p-channel transistor 102 are connected to each other and to a drain region of the p-channel transistor 102. A drain region of the p-channel transistor 101 is connected to a drain region of the n-channel transistor 103 and an output signal out is obtained from this node. A source region of the n-channel transistor 103 is connected to a gate electrode of an n-channel transistor 104. A source region of the n-channel transistor 104 is connected to a gate electrode of the n-channel transistor 103. A first input signal in1 (voltage Vin1) is inputted to the gate electrode of the n-channel transistor 103 and a second input signal in2 (voltage Vin2) is inputted to the gate electrode of the n-channel transistor 104.

Next, description is made on a basic operation of the semiconductor device of this embodiment mode. Here, description is made as an example on the case of using a semiconductor device of this embodiment mode as a level shifter. It is to be noted that each of the first and second input signals has amplitude of a difference between the voltage level VSS1 and the voltage level VDD1. The first wire 105 and the second wire 106 are both applied a power source potential VDD2 and an inverted signal of the first input signal is inputted as the second input signal. Here, the power source potentials are set to satisfy VSS1<VDD1<VDD2.

First, a signal with amplitude of a difference between the voltage level VSS1 and the voltage level VDD1 is inputted to the gate electrode of the n-channel transistor 103 as the first input signal in1. A signal with amplitude of a difference between the voltage level VSS1 and the voltage level VDD1 is inputted to the gate electrode of the n-channel transistor 104 as the second input signal. Here, the source region of the n-channel transistor 103 is connected to the gate electrode of the n-channel transistor 104; therefore, a source potential of the n-channel transistor 103 becomes Vin2. Similarly, the source region of the n-channel transistor 104 is connected to the gate electrode of the n-channel transistor 103; therefore, a source potential of the n-channel transistor 104 becomes Vin1.

When a High signal is inputted as the first input signal, the second input signal becomes a Low signal. Therefore, the source potential of the n-channel transistor 103 becomes VSS1 and the n-channel transistor 103 becomes conductive. Then, a drain potential of the n-channel transistor 103 becomes VSS1. On the other hand, the gate electrode and the drain region of the p-channel transistor 102 are connected to each other; therefore, the p-channel transistor 102 operates in a saturation region. Accordingly, a potential obtained by dividing a voltage between VDD2 and Vin1 by resistance of the n-channel transistor 104 and the p-channel transistor 102 is inputted to the gate electrode of the p-channel transistor 101. This potential is expressed as $V_{101}$. When the first input signal in1 is a High signal, the second input signal becomes a Low signal. Therefore, the source potential of the n-channel transistor 104 becomes VDD1 and the n-channel transistor 104 becomes non-conductive. Accordingly, the potential $V_{101}$ inputted to the gate electrode of the p-channel transistor 101 becomes higher in accordance with the power source potential VDD2. Therefore, the p-channel transistor 101 becomes non-conductive and a potential of the output signal out becomes VSS1.

When a Low signal is inputted as the first input signal, the second input signal becomes a High signal. Therefore, the source potential of the n-channel transistor 103 becomes VDD1 and the n-channel transistor becomes non-conductive. On the other hand, the source potential of the n-channel transistor 104 becomes VSS1 and an n-channel transistor 604 becomes conductive. Accordingly, the potential $V_{101}$ inputted to the gate electrode of the p-channel transistor 101 becomes lower in accordance with the power source potential VSS1. Accordingly, the p-channel transistor 101 becomes conductive and a potential of the output signal out becomes VDD2.

Figure 22A:
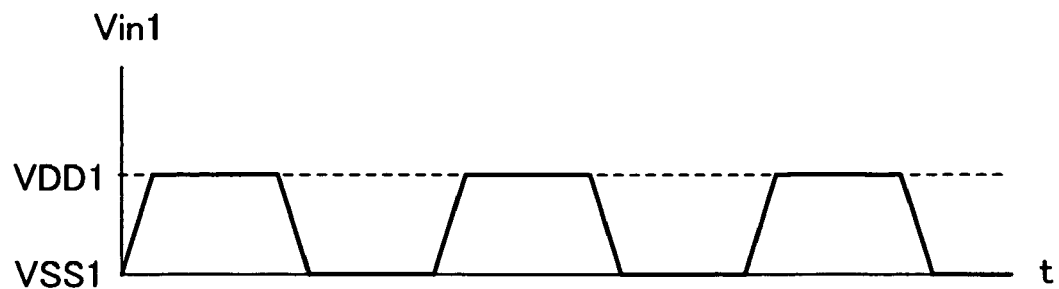
FIG. 22 shows diagrams each showing an operation of a level shifter described in Embodiment Mode 1.
Figure 22B:
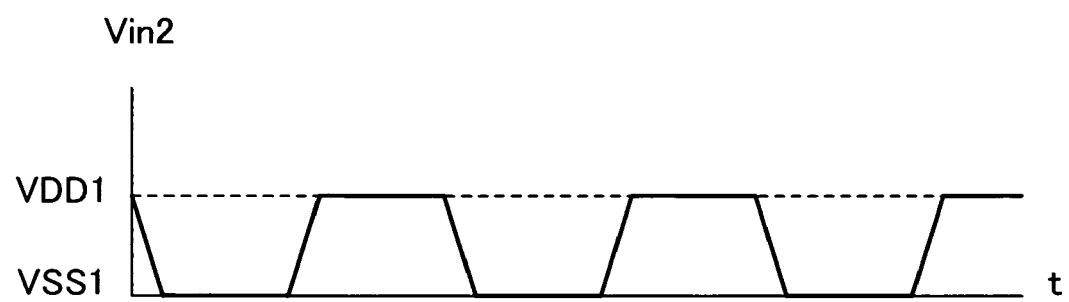
Figure 22C:
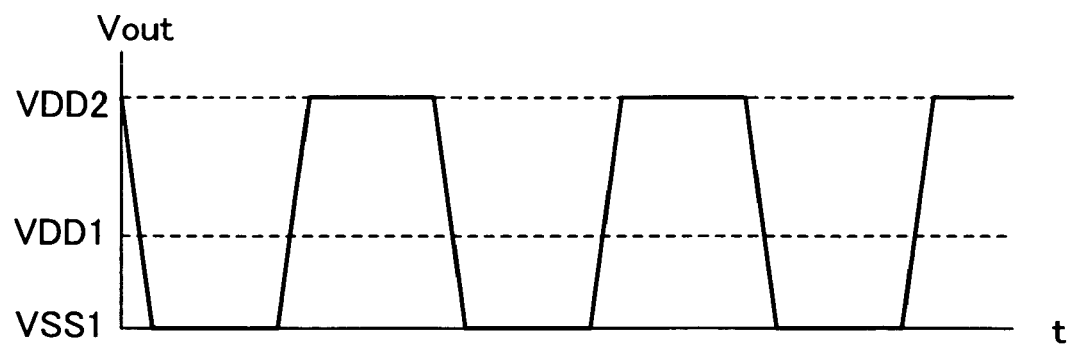

FIG. 22 shows output waveforms of the semiconductor device of this embodiment mode. FIGS. 22(A) to 22(C) show a time passage of the potential Vin1 of the first input signal in, the potential Vin2 of the second input signal in2, and the potential Vout of the output signal out respectively.

In this manner, the input signal with amplitude of a difference between the voltage level VSS1 and the voltage level VDD1 is converted into an output signal with amplitude of a difference between the voltage level VSS1 and the voltage level VDD2.

Figure 2A:
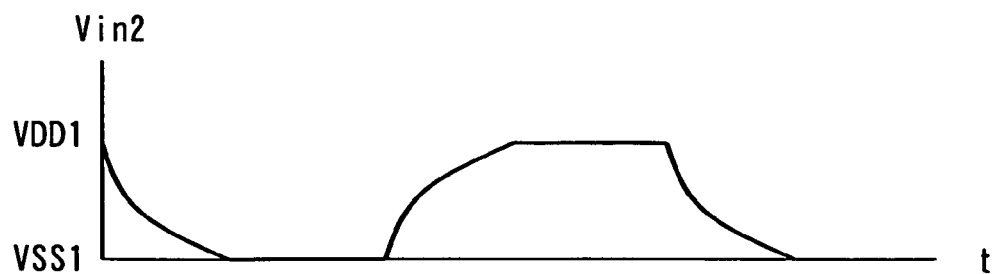
FIG. 2 shows diagrams each showing an effect of the invention.
Figure 2B:
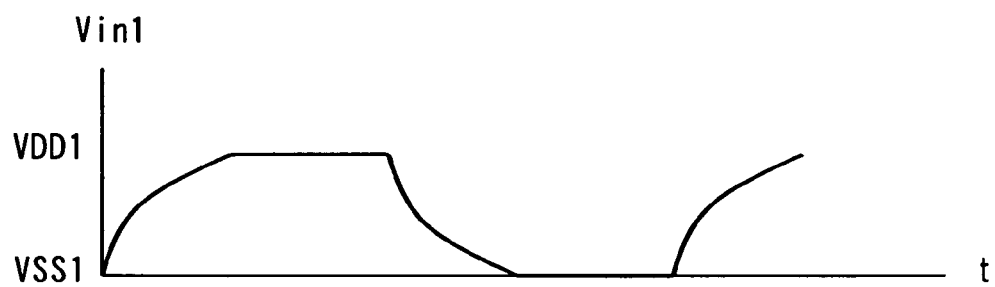

Here, description is made with reference to FIG. 2 on the case where the second input signal in2 changes from a High signal to a Low signal. FIG. 2(A) shows the ordinate showing the potential of the second input signal in2 and the abscissa showing a time passage of the second input signal in2. FIG. 2(B) shows the ordinate showing the potential of the first input signal in1 and the abscissa showing a time passage of the first input signal in1. A gate-source voltage $Vgs_{104}$ of the n-channel transistor 104 can be obtained by the following formula (2).

$$Vgs_{104} = Vin2 - Vin1 \qquad (2)$$

Figure 2C:
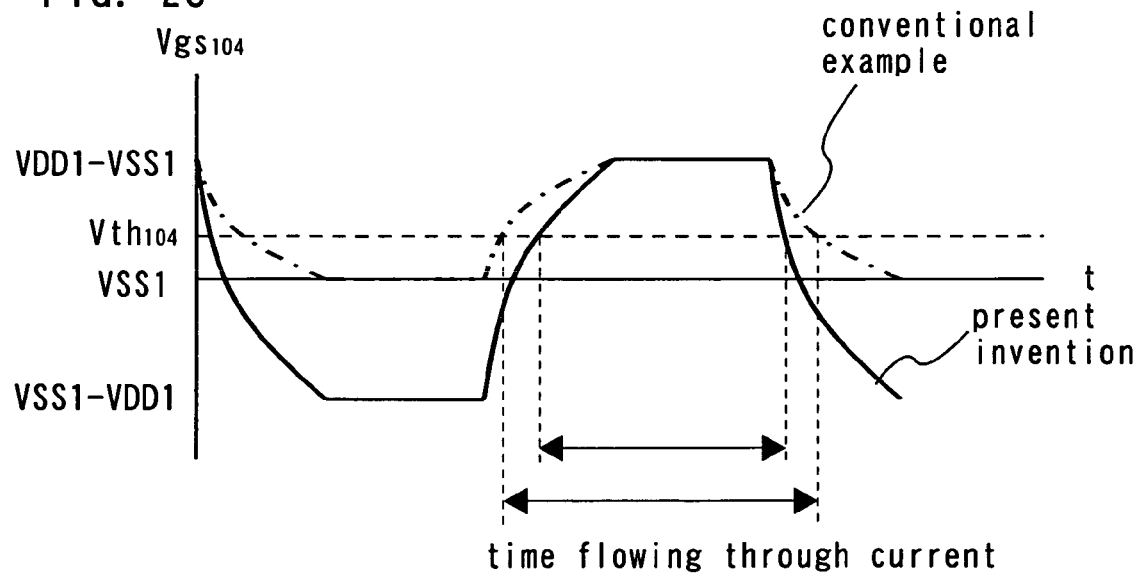

Here, a time passage of $Vgs_{104}$ is shown in FIG. 2(C). In particular, in the case where the second input signal in2 changes from a High signal to a Low signal over a long time, Vin1 increases from VSS1 to VDD1 at the same time as Vin2 decreases from VDD1 to VSS1. Therefore, compared with the conventional level shifter, time required for $Vgs_{104}$ to be a level of a threshold voltage $Vth_{104}$ of the n-channel transistor 104 or lower can be reduced. That is, time required for the n-channel transistor 104 to be non-conductive can be reduced. Accordingly, a current flowing between VDD2 and VSS1 through the p-channel transistor 102 and the n-channel transistor 104 can be reduced. As a result, power consumption is reduced. Further, due to the reduction in current, distortion of an output waveform can be suppressed.

Further, similarly in the case where the second input signal in2 changes from a Low signal to a High signal, Vin1 decreases from VDD1 to VSS1 at the same time as Vin2 increases from VSS1 to VDD1. Therefore, time required for $Vgs_{104}$ which is as high as a threshold voltage $Vth_{104}$ of the n-channel transistor 104 or higher reaches VDD2 can be reduced. That is, time required for the second n-channel transistor 104 to be conductive can be reduced. Accordingly, a current flowing between VDD2 and VSS1 through the p-channel transistor 102 and the n-channel transistor 104 can be reduced. As a result, power consumption is reduced. Further, due to the reduced current, distortion of an output waveform can be suppressed.

Figure 3:
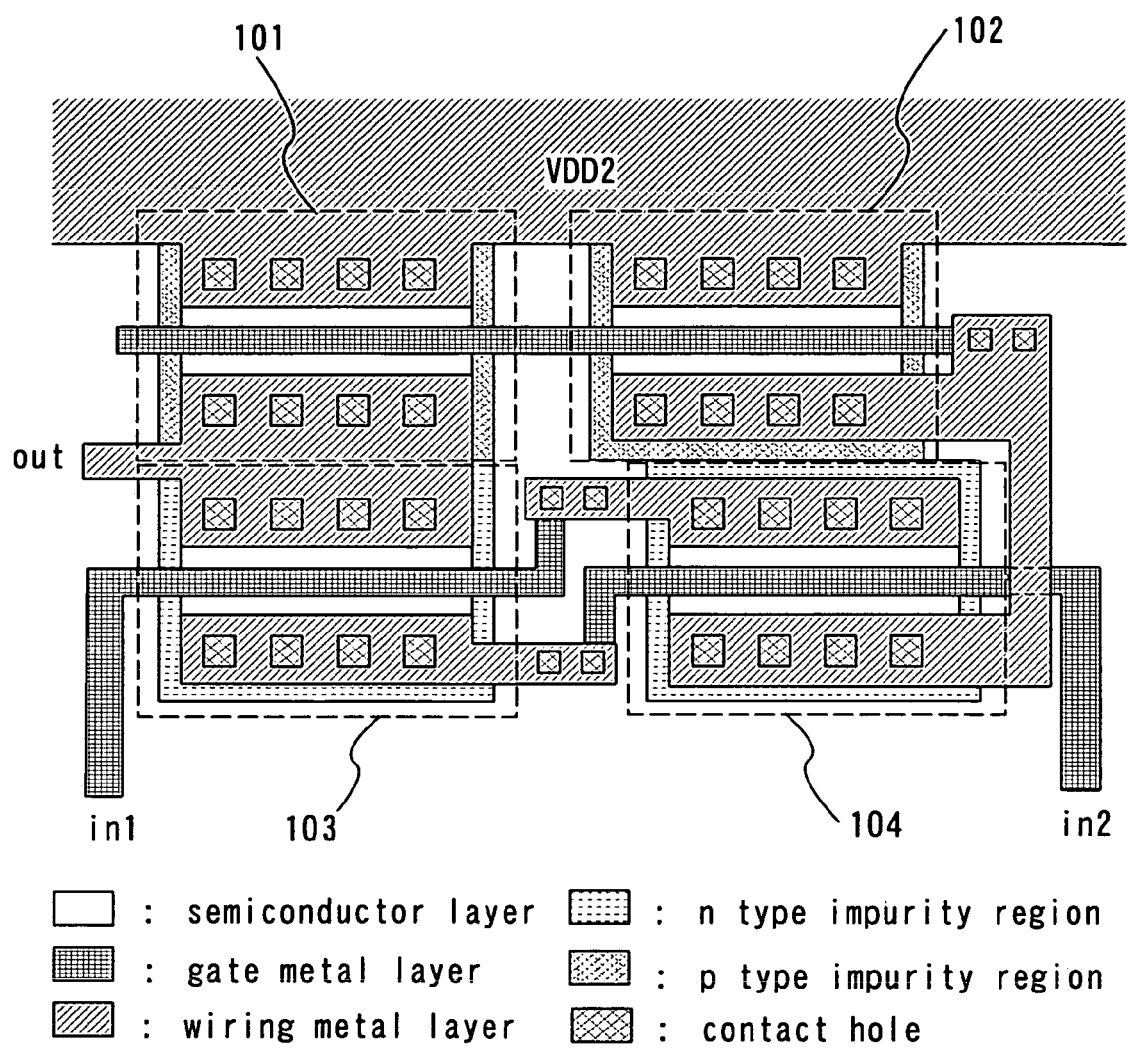
FIG. 3 shows a diagram showing an example of a top plan view of a level shifter described in Embodiment Mode 1.

Here, FIG. 3 shows a top plan view of the level shifter of this embodiment mode. Transistors (the p-channel transistor 101, the p-channel transistor 102, the n-channel transistor 103, and the n-channel transistor 104) shown in FIG. 3 correspond to the transistors' numbers the p-channel transistor 101, the p-channel transistor 102, the n-channel transistor 103, and the n-channel transistor 104 in the circuit diagram shown in FIG. 1 respectively.

It is to be noted that an insulating film is provided between a wire metal and a gate metal, and between the gate metal and a semiconductor layer and that there is no short-circuit at overlapped portions thereof. They are connected to each other at a portion provided with a contact hole.

Figure 4:
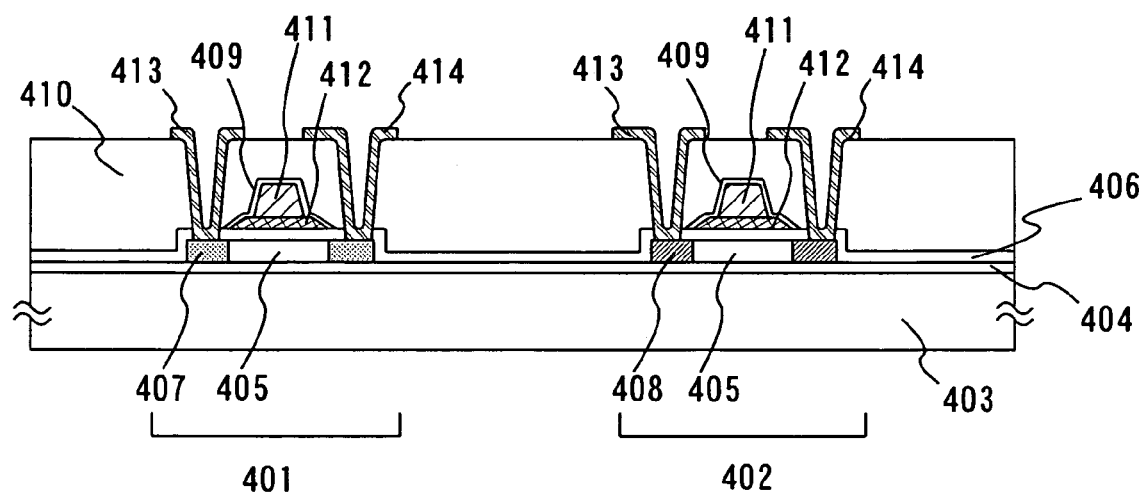
FIG. 4 shows a diagram showing an example of a cross section of a CMOS transistor.

Here, as an example of a transistor used in this embodiment mode, a cross section of a CMOS transistor is shown in FIG. 4. Reference numeral 401 denotes an n-channel transistor and 402 denotes a p-channel transistor. Reference numeral 403 denotes a substrate. Reference numeral 404 denotes a base film. The base film is formed of an insulating film such as a silicon oxide film, a silicon nitride film, and a silicon oxynitride film. Reference numeral 405 denotes a semiconductor layer. As a material of the semiconductor layer, silicon, a silicon-germanium alloy, and the like can be used. Reference numeral 406 denotes a gate insulating film which covers the semiconductor layer. An insulating film containing silicon is used for the gate insulating film. Reference numerals 411 and 412 denote a first conductive film and a second conductive film respectively. The first and second conductive films are formed to form gate electrodes using an element selected from Ta, W, Ti, Mo, Al, Cu, and the like, or an alloy material or a compound material containing the aforementioned element as a main component. Reference numeral 407 denotes an n-type impurity region. The n-type impurity region is formed in a self-aligned manner by first doping treatment to add an impurity element (typically, phosphorus or arsenic is used) which imparts n-type conductivity. Reference numeral 408 denotes a p-type impurity region. The p-type impurity region is formed in a self-aligned manner by second doping treatment to add an impurity element (typically, boron is used) which imparts p-type conductivity only to a semiconductor layer of the p-channel transistor. Reference numerals 409 and 410 denote a first interlayer insulating film and a second interlayer insulating film respectively. Reference numeral 413 denotes a source wire 413 which forms a contact with a source region of the semiconductor layer and 414 denotes a drain wire which forms a contact with a drain region thereof.

It is to be noted in the invention that a kind of a transistor applicable to the invention is not limited, and a transistor used for the invention may be a thin film transistor (TFT) using a non-single crystal semiconductor film represented by amorphous silicon or polycrystalline silicon, a MOS transistor formed by using a semiconductor substrate or an SOI substrate, a junction transistor, a bipolar transistor, a transistor using an organic semiconductor or a carbon nanotube, or the like. Furthermore, a substrate on which a transistor is mounted is not exclusively limited to a certain type. It may be a single crystalline substrate, an SOI substrate, a glass substrate, and the like.

It is preferable that the level shifter of this embodiment mode have transistors with few variations in characteristics due to its operating characteristics. Therefore, the transistors which form each circuit are preferably arranged close to each other. Also, when a manufacturing process of a transistor substrate includes laser irradiation or the like, variations in characteristics of the transistors due to uneven irradiation or the like can be reduced by closely arranging the transistors as shown in FIG. 3. In addition, since the aforementioned laser irradiation or the like is normally carried out in a form of linear irradiation, it is preferable to arrange each transistor in parallel with one another as the variations in characteristics of the transistors due to aforementioned uneven irradiation or the like can further be reduced.

It is to be noted that FIG. 3 shows an example of a top plan view of the level shifter described in this embodiment mode and the level shifter circuit described in this embodiment mode is not limited to the configuration shown in FIG. 3.

It is to be noted in this embodiment mode that an inverted signal of the first input signal is the second input signal; however, it is not limited to this. In the case of using it as a differential circuit, any signal may be used as long as the potentials Vin1 and Vin2 of the two input signals have a difference from each other. Further, a power source voltage is applied to the first wire 105 and the second wire 106; however, the invention is not limited to this, and a signal from another circuit or a clock signal may be inputted thereto. Further, different potentials may be applied to the first wire 105 and the second wire 106.

EMBODIMENT MODE 2

Figure 5:
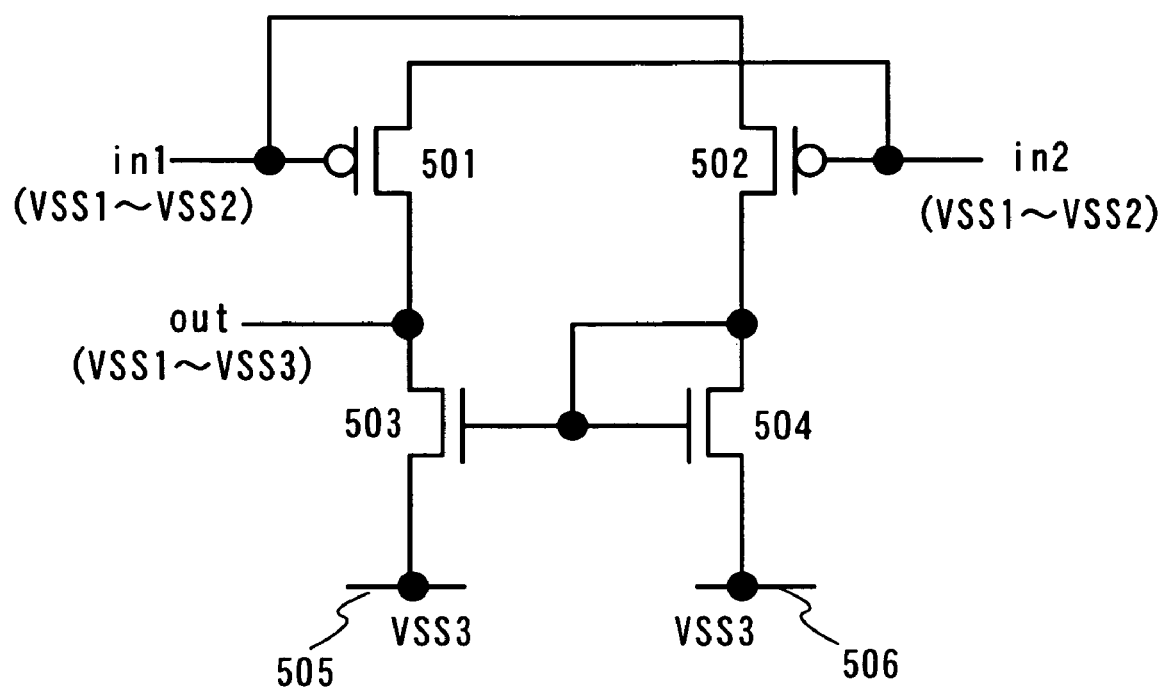
FIG. 5 shows a circuit diagram showing an example of a level shifter described in Embodiment Mode 2.
Figure 6A:
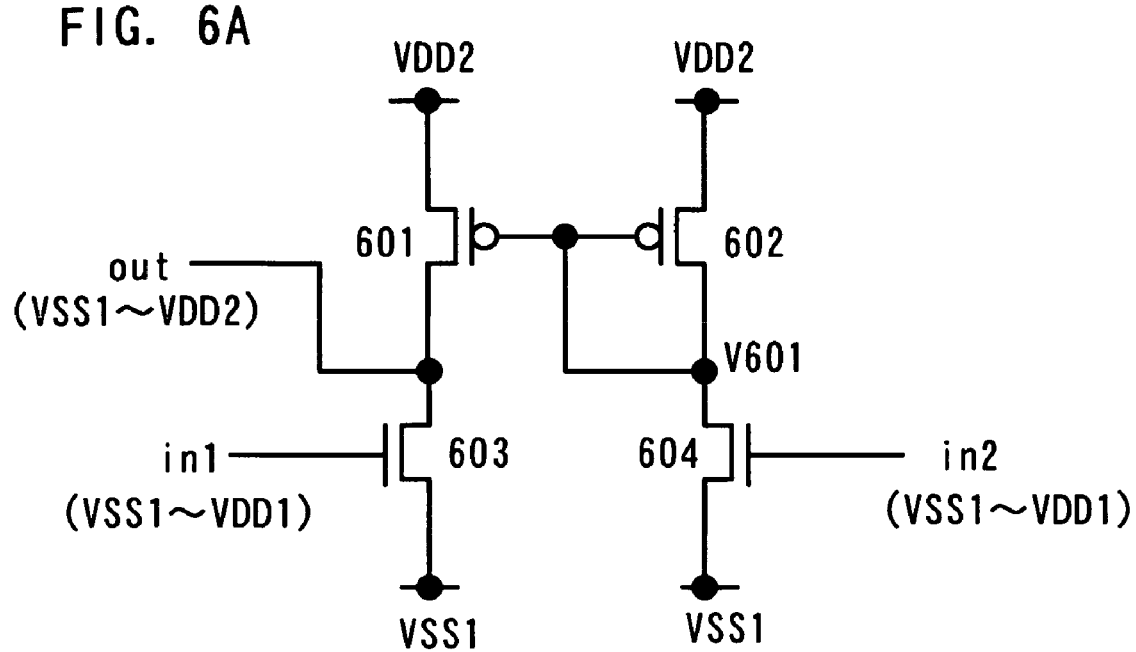
FIG. 6 shows circuit diagrams each showing an example of a conventional level shifter.
Figure 6B:
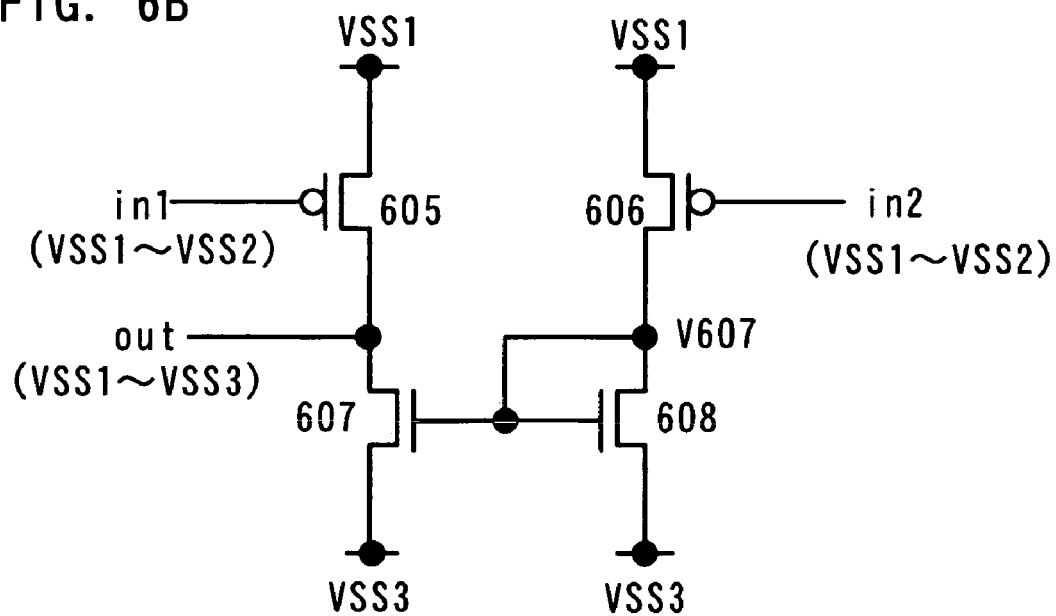
Figure 7A:
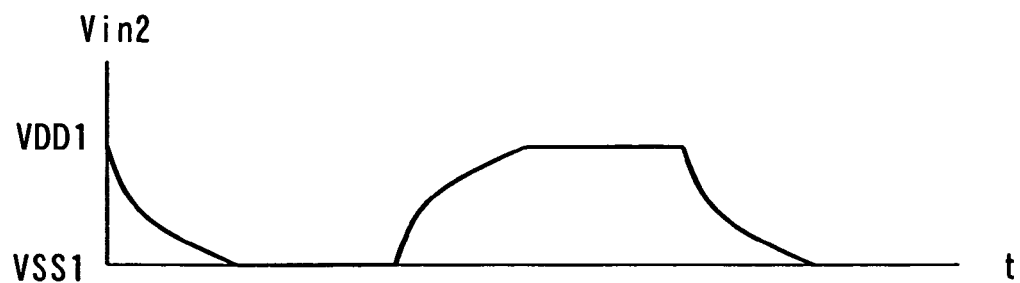
FIG. 7 shows diagrams each showing a problem of a conventional level shifter.
Figure 7B:
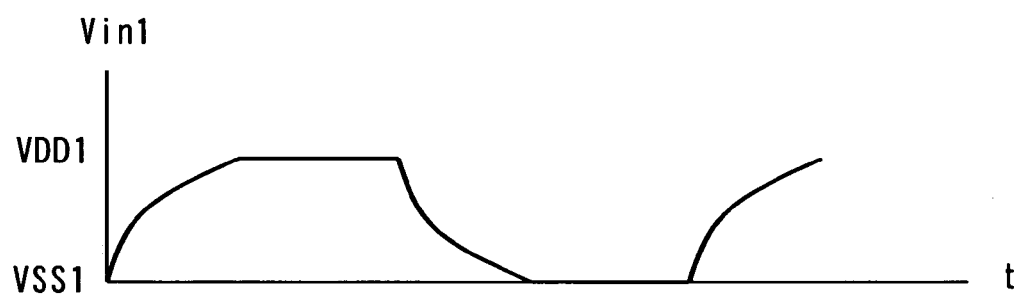
Figure 7C:
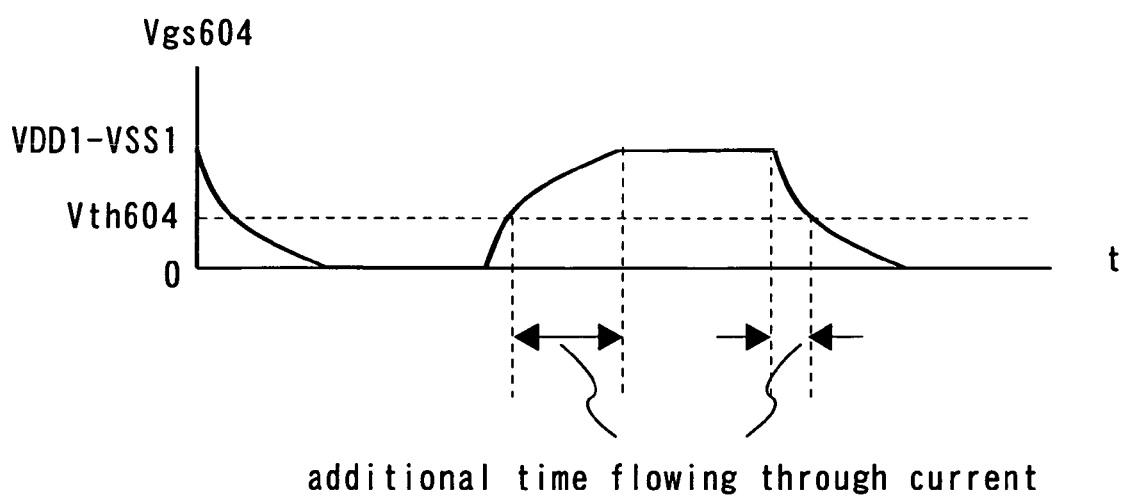

In this embodiment mode, description is made with reference to FIG. 5 on the case where the polarity of the transistor is changed in Embodiment Mode 1.

FIG. 5 shows a circuit diagram of a semiconductor device of this embodiment mode. The semiconductor device of this embodiment mode has the following configuration. A source region of an n-channel transistor 503 is connected to a first wire 505. A source region of an n-channel transistor 504 is connected to a second wire 506. Gate electrodes of the n-channel transistor 503 and the n-channel transistor 504 are connected to each other and to a drain region of the n-channel transistor 504. A drain region of the n-channel transistor 503 is connected to a drain region of a p-channel transistor 501 and an output signal out is obtained from this node. A source region of the p-channel transistor 501 is connected to a gate electrode of a p-channel transistor 502 and a source region of the p-channel transistor 502 is connected to a gate electrode of the p-channel transistor 501. A first input signal in1 (voltage Vin1) is inputted to the gate electrode of the p-channel transistor 501 and a second input signal in2 (voltage Vin2) is inputted to the gate electrode of the p-channel transistor 502.

Next, description is made on a basic operation of the semiconductor device of this embodiment mode. Here, description is made as an example on the case of using the semiconductor device of this embodiment mode as a level shifter. It is to be noted that each of the first and second input signals has amplitude of a difference between a voltage level VSS1 and a voltage level VSS2. The first wire 505 and the second wire 506 are both applied a power source potential VSS3. An inverted signal of the first input signal is inputted as the second input signal. Here, the power source potentials are set to satisfy VSS3<VSS2<VSS1.

First, a signal with amplitude of a difference between the voltage level VSS1 and the voltage level VSS2 is inputted as the first input signal in1 to the gate electrode of the p-channel transistor 501, and a signal with amplitude of a difference between the voltage level VSS1 and the voltage level VSS2 is inputted as the second input signal to the gate electrode of the p-channel transistor 502. Here, as the source region of the p-channel transistor 501 is connected to the gate electrode of the p-channel transistor 502, a source potential of the p-channel transistor 501 becomes Vin2. Similarly, as the source region of the p-channel transistor 502 is connected to the gate electrode of the p-channel transistor 501, a source potential of the p-channel transistor 502 becomes Vin1.

When a High signal is inputted as the first input signal, the second input signal becomes a Low signal. Therefore, the source potential of the p-channel transistor 501 becomes VSS2 and the p-channel transistor 501 becomes non-conductive. On the other hand, as the gate electrode and the drain region of the n-channel transistor 504 are connected, the n-channel transistor 504 operates in a saturation region. Accordingly, a potential obtained by dividing a voltage between Vin1 and VSS3 by resistance of the p-channel transistor 502 and the n-channel transistor 504 is inputted to the gate electrode of the n-channel transistor 503. This potential is expressed as $V_{503}$. When the first input signal in1 is a High signal, the second input signal becomes a Low signal. Therefore, the source potential of the p-channel transistor 502 becomes VSS1 and the p-channel transistor 502 becomes conductive. Accordingly, the potential $V_{503}$ inputted to the gate electrode of the n-channel transistor 503 becomes higher in accordance with the power source potential VSS1. Therefore, the n-channel transistor 503 becomes conductive and a potential of the output signal out becomes VSS3.

When a Low signal is inputted as the first input signal, the second input signal becomes a High signal. Therefore, the source potential of the p-channel transistor 501 becomes VSS1 and the p-channel transistor 501 becomes conductive. Then, the drain potential of the p-channel transistor 501 becomes VSS1. On the other hand, the source potential of the p-channel transistor 502 becomes VSS2 and the p-channel transistor 502 becomes non-conductive. Accordingly, the potential $V_{503}$ inputted to the gate electrode of the n-channel transistor 503 becomes lower in accordance with the power source potential VSS3. Therefore, the n-channel transistor 503 becomes non-conductive and a potential of the output signal out becomes VSS1.

Figure 23A:
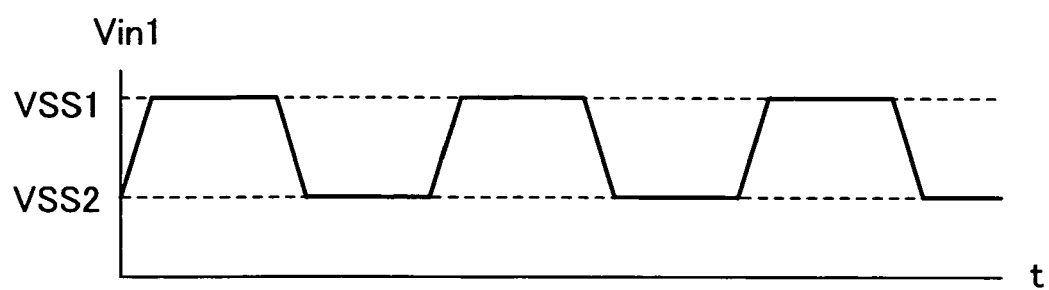
FIG. 23 shows diagrams each showing an operation of a level shifter described in Embodiment Mode 2.
Figure 23B:
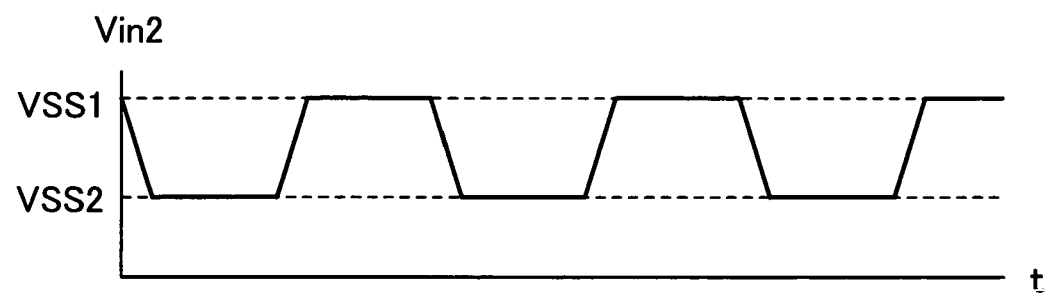
Figure 23C:
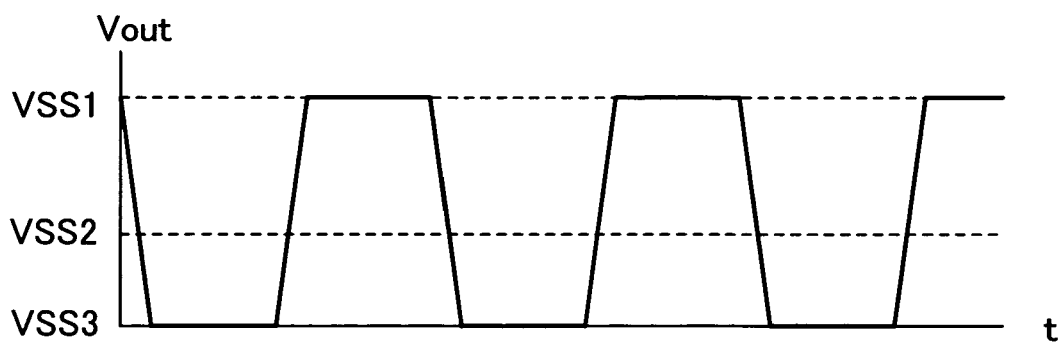

FIG. 23 shows output waveforms of the semiconductor device of this embodiment mode. FIGS. 23(A) to 23(C) show a time passage of the potential Vin1 of the first input signal in1, the potential Vin2 of the second input signal in2, and a potential Vout of the output signal out respectively.

In this manner, an input signal with amplitude of a difference between the voltage level VSS1 and the voltage level VSS2 is converted into an output signal with amplitude of a difference between the voltage level VSS1 and the voltage level VSS3.

It is to be noted in this embodiment mode that an inverted signal of the first input signal is the second input signal; however, it is not limited to this. In the case of a differential circuit, any signal may be used as long as the potentials Vin1 and Vin2 of the two input signals have a difference from each other. Further, a power source voltage is applied to the first wire 505 and the second wire 506; however, the invention is not limited to this, and a signal from another circuit or a clock signal may be inputted thereto. Further, different potentials may be applied to the first wire 505 and the second wire 506.

EMBODIMENT MODE 3

In Embodiment Mode 1 (FIG. 1), when a threshold voltage of each of the n-channel transistors 103 and 104 is higher than voltage amplitude of each of the input signals in1 and in2, the n-channel transistor 103 and the n-channel transistor 104 become non-conductive and do not operate normally in some cases. In view of this, in this embodiment mode, gate potentials applied to the n-channel transistor 103 and the n-channel transistor 104 are set high so that the n-channel transistor 103 and the n-channel transistor 104 can easily be conductive.

Figure 8:
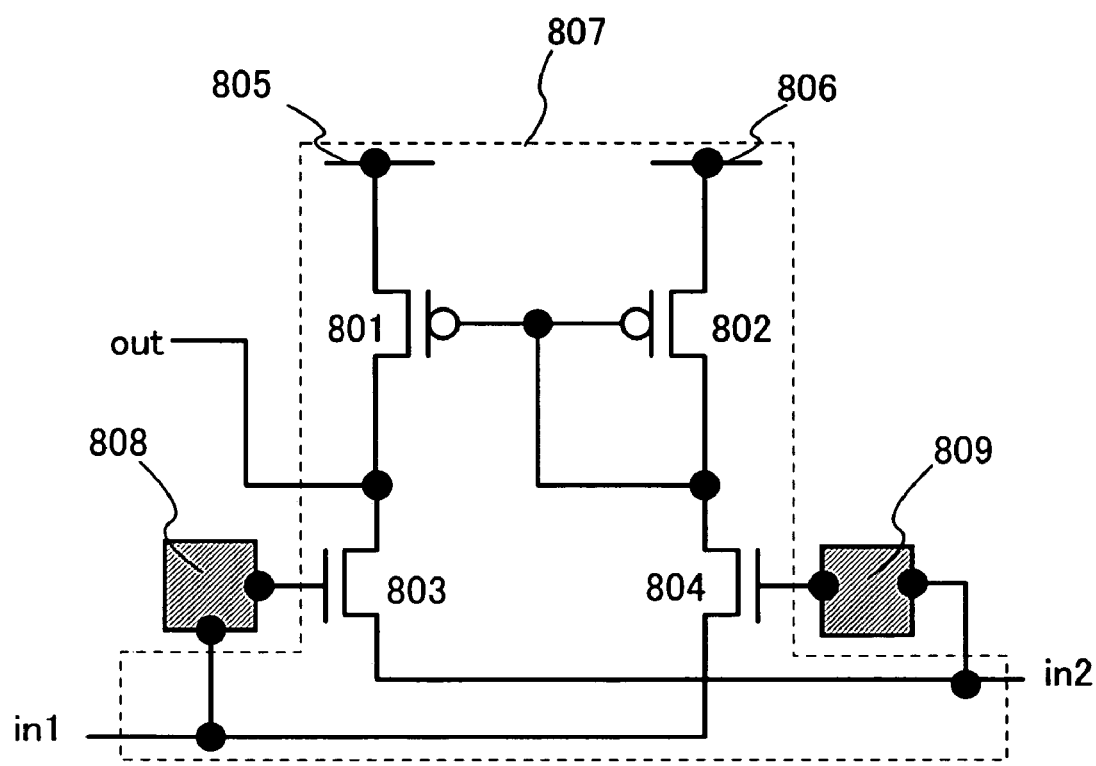
FIG. 8 shows a circuit diagram showing an example of a semiconductor device described in Embodiment Mode 3.

First, description is made with reference to FIG. 8 on a basic configuration of the semiconductor device of this embodiment mode.

The semiconductor device of this embodiment mode is formed of a differential circuit portion 807, a first level shifter circuit 808, and a second level shifter circuit 809. The differential circuit portion 807 has a following configuration. A source region of a p-channel transistor 801 is connected to a first wire 805. A source region of a p-channel transistor 802 is connected to a second wire 806. Gate electrodes of the p-channel transistor 801 and the p-channel transistor 802 are connected to each other and to a drain region of the p-channel transistor 802. A drain region of the p-channel transistor 801 is connected to a drain region of an n-channel transistor 803 and an output signal out is obtained from this node. A first input signal in1 (voltage Vin1) is inputted to a source region of an n-channel transistor 804 and a second input signal in2 (voltage Vin2) is inputted to a source region of the n-channel transistor 803. The first level shifter circuit 808 is connected to a gate electrode of the n-channel transistor 803 and the source region of the n-channel transistor 804. The second level shifter circuit 809 is connected to a gate electrode of the n-channel transistor 804 and the source region of the n-channel transistor 803.

Figure 9:
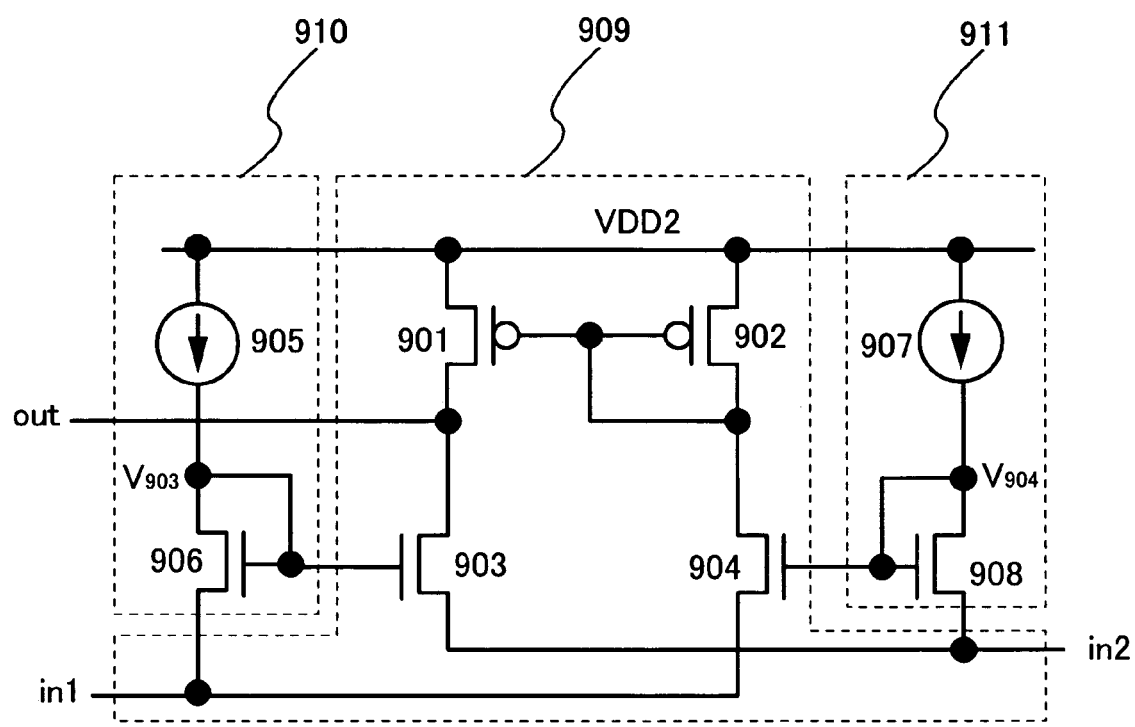
FIG. 9 shows a circuit diagram showing an example of a level shifter described in Embodiment Mode 3.

Here, description is made with reference to FIG. 9 on the case of using the semiconductor device of this embodiment mode as a level shifter. FIG. 9 is a specific diagram of the first level shifter circuit 808 and the second level shifter circuit 809. It is to be noted that each of the first and second input signals has amplitude of a difference between the voltage level VSS1 and the voltage level VDD1, the first wire 805 and the second wire 806 are both applied a power source potential VDD2, and an inverted signal of the first input signal is inputted as the second input signal. Here, the power source potentials are set to satisfy VSS1<VDD1<VDD2.

The level shifter of this embodiment mode is formed of a differential circuit portion 909, a first level shifter circuit 910, and a second level shifter circuit 911. The differential circuit portion 909 is formed of a p-channel transistor 901, a p-channel transistor 902, an n-channel transistor 903, and an n-channel transistor 904. The first level shifter circuit 910 is formed of a current source 905 and an n-channel transistor 906. A gate electrode of the n-channel transistor 906 and a gate electrode of the n-channel transistor 903 included in the differential circuit portion 909 are connected to each other and to a drain region of the n-channel transistor 906 and the current source 905. The second level shifter circuit 911 is formed of a current source 907 and an n-channel transistor 908. A gate electrode of the n-channel transistor 908 and a gate electrode of the n-channel transistor 904 included in the differential circuit portion 909 are connected to each other and to a drain region of the n-channel transistor 908 and the current source 907. As for an input signal, the first input signal in1 (voltage Vin1) is inputted to source regions of the n-channel transistor 904 included in the differential circuit portion 909 and of the n-channel transistor 906 included in the first level shifter circuit 910. The second input signal in2 (voltage Vin2) is inputted to source regions of the n-channel transistor 903 included in the differential circuit portion 909 and of the n-channel transistor 908 included in the second level shifter circuit 911.

Next, description is made on a basic operation of the level shifter of this embodiment mode.

First, a signal with amplitude of a difference between the voltage level VSS1 and the voltage level VDD1 is inputted as the first input signal in1 to source regions of the n-channel transistor 904 and the n-channel transistor 906. A signal with amplitude of a difference between the voltage level VSS1 and the voltage level VDD1 is inputted as the second input signal in2 to source regions of the n-channel transistor 903 and the n-channel transistor 908. Accordingly, each of source potentials of the n-channel transistor 904 and the n-channel transistor 906 becomes Vin1 and each of source potentials of the n-channel transistor 903 and the n-channel transistor 908 becomes Vin2.

Next, description is made on operations of the first level shifter circuit 910 and the second level shifter circuit 911. Each of the n-channel transistor 906 and the n-channel transistor 908 has a gate electrode and a drain region connected to each other; therefore, the n-channel transistor 906 and the n-channel transistor 908 both operate in a saturation region. Accordingly, a potential obtained by resistance division of a voltage between Vin1 and VDD2 is inputted to the gate electrode of the n-channel transistor 903. This potential is expressed as $V_{903}$. Similarly, a potential obtained by resistance division of a voltage between Vin2 and VDD2 is inputted to the gate electrode of the n-channel transistor 904. This potential is expressed as $V_{904}$. It is to be noted that the level shifter circuit 910 and the level shifter circuit 911 are set so that at least one of the potentials $V_{903}$ and $V_{904}$ inputted to the gate electrodes of the n-channel transistor 903 and the n-channel transistor 904 becomes higher than a threshold voltage of each of the n-channel transistor 903 and the n-channel transistor 904.

When the first input signal in1 is a High signal, the second input signal becomes a Low signal. Therefore, the input potentials $V_{903}$ and $V_{904}$ to the differential circuit portion 909 are set so as to satisfy $V_{903}>V_{904}$. Further, a source potential of the n-channel transistor 903 becomes VSS1 and a source potential of the n-channel transistor 904 becomes VDD1. Accordingly, a gate-source voltage of the n-channel transistor 903 becomes high and a gate-source voltage of the n-channel transistor 904 becomes low. Therefore, a potential of an output signal out falls to be VSS1 due to the differential circuit portion 909. It is to be noted that a basic operation of the differential circuit portion 909 is the same as that of the level shifter (FIG. 1) described in Embodiment Mode 1; therefore, detailed description thereof is omitted here.

When the first input signal in1 is a Low signal, the second input signal becomes a High signal. Therefore, the input potentials $V_{903}$ and $V_{904}$ to the differential circuit portion 909 are set to satisfy $V_{903}<V_{904}$. Further, the source potential of the n-channel transistor 903 becomes VDD1 and the source potential of the n-channel transistor 904 becomes VSS1. Accordingly, the gate-source voltage of the n-channel transistor 903 becomes low and the gate-source voltage of the n-channel transistor 904 becomes high. Therefore, a potential of an output signal out rises to be VDD2 due to the differential circuit portion 909.

In this manner, an input signal with amplitude of a difference between the voltage level VSS1 and the voltage level VDD1 is converted into an output signal with amplitude of a difference between the voltage level VSS1 and the voltage level VDD2.

The level shifter of this embodiment mode can realize reduction in power consumption as well as suppressing distortion of an output waveform by reducing the current when converting voltage amplitude. Further, by using the first level shifter circuit 910 and the second level shifter circuit 911, the gate potentials $V_{903}$ and $V_{904}$ applied to the n-channel transistor 903 and the n-channel transistor 904 can be set higher than the threshold voltage of each of the n-channel transistor 903 and the n-channel transistor 904. Therefore, an operation is possible even when the threshold voltage of each of the n-channel transistor 903 and the n-channel transistor 904 is higher than voltage amplitude of the input signal.

Figure 10A:
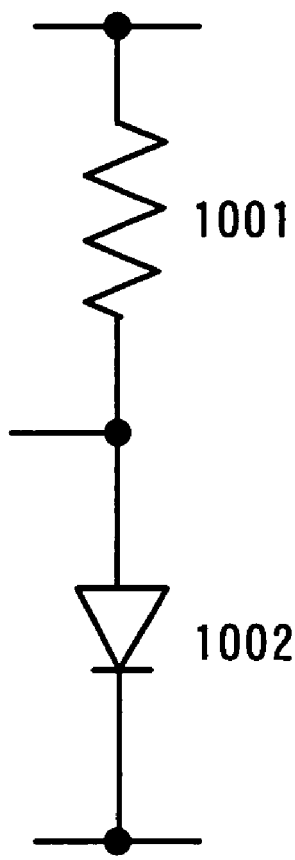
FIG. 10 shows diagrams each showing an example of a level shifter described in Embodiment Mode 3.
Figure 10B:
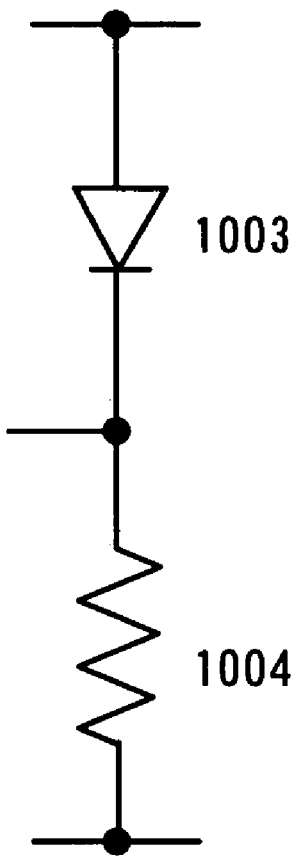
Figure 10C:
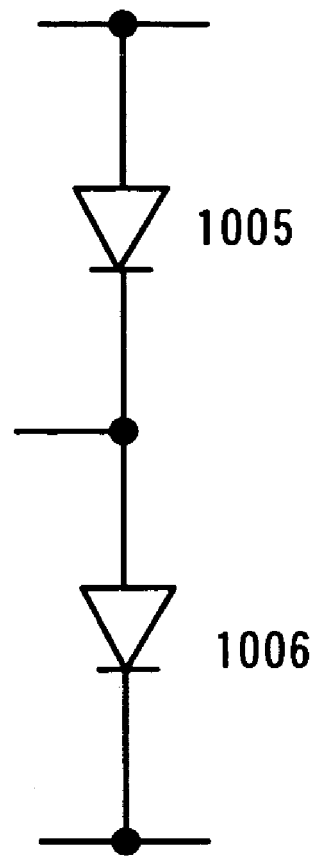

It is to be noted that the level shifter circuit shown in FIG. 9 is a circuit using a current source; however, the level shifter circuit of this embodiment mode is not limited to this. Examples of a circuit which can be used as a level shifter circuit are shown in FIG. 10. FIG. 10(A) is a circuit in which a resistor 1001 and a diode 1002 are connected in series. FIG. 10(B) is a circuit in which a diode 1003 and a resistor 1004 are connected in series, which is an opposite connection to the circuit shown in FIG. 10(A). FIG. 10(C) is a circuit in which a diode 1005 and a diode 1006 are connected in series. It is to be noted that the circuits shown in FIG. 10 are examples of the level shifter circuit and the invention is not limited to these.

In this embodiment mode, an inverted signal of the first input signal is the second input signal; however, it is not limited to this. In the case of a differential circuit, any signal may be used as long as the potentials Vin1 and Vin2 of the two input signals have a difference from each other. Further, a power source voltage is applied to the first wire 805 and the second wire 806; however, the invention is not limited to this, and a signal from another circuit or a clock signal may be inputted thereto. Further, different potentials may be applied to the first wire 805 and the second wire 806.

EMBODIMENT MODE 4

Figure 11:
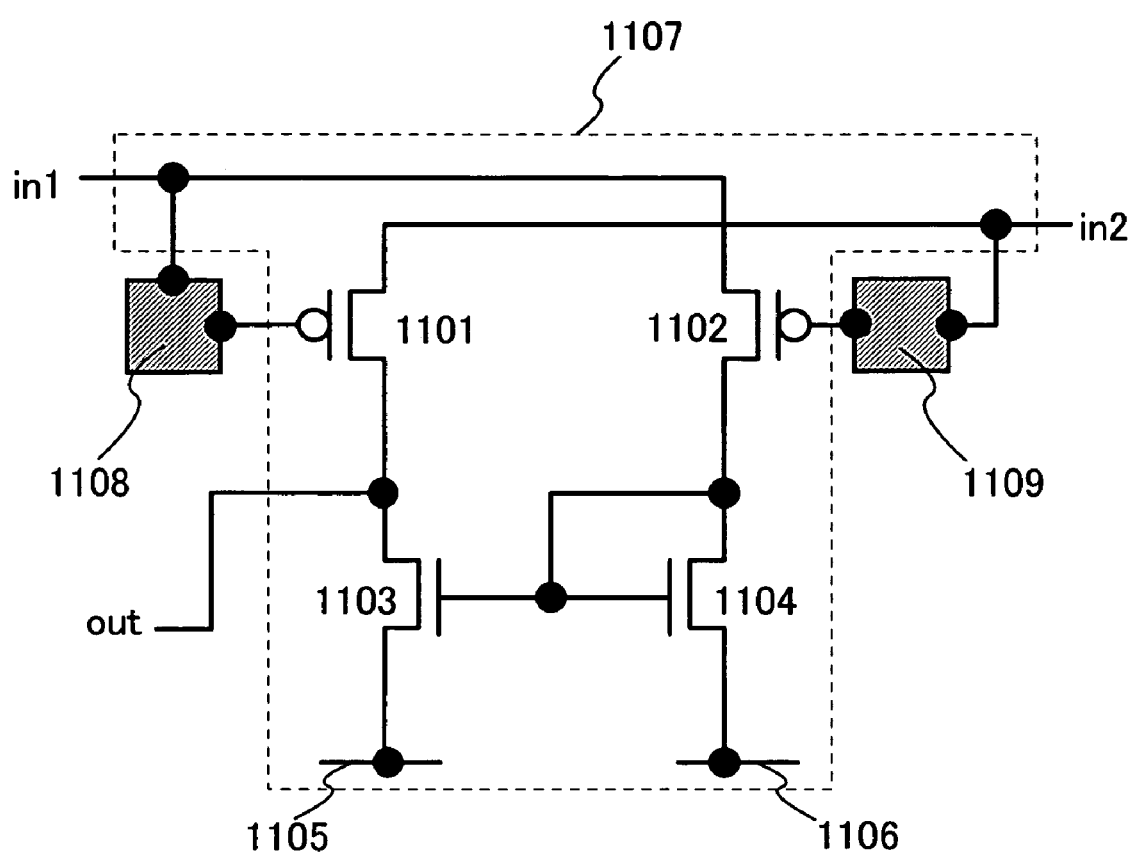
FIG. 11 shows a circuit diagram showing an example of a semiconductor device described in Embodiment Mode 4.

In this embodiment mode, description is made with reference to FIG. 11 on the case where the polarity of the transistor is changed in Embodiment Mode 3. In Embodiment Mode 2 (FIG. 5), when the threshold voltage of each of the p-channel transistor 501 and the p-channel transistor 502 is lower than voltage amplitude of each of the input signals in1 and in2, the p-channel transistor 501 and the p-channel transistor 502 become non-conductive and do not operate normally in some cases. In view of this, in this embodiment mode, gate potentials applied to the p-channel transistor 501 and the p-channel transistor 502 are set lower so that the p-channel transistor 501 and the p-channel transistor 502 can easily be conductive.

The semiconductor device of this embodiment mode is formed of a differential circuit portion 1107, a first level shifter circuit 1108, and a second level shifter circuit 1109. The differential circuit portion 1107 has a following configuration. A source region of an n-channel transistor 1103 is connected to a first wire 1105. A source region of an n-channel transistor 1104 is connected to a second wire 1106. Gate electrodes of the n-channel transistor 1103 and the n-channel transistor 1104 are connected to each other and to a drain region of the n-channel transistor 1104. A drain region of the n-channel transistor 1103 is connected to a drain region of a p-channel transistor 1101 and an output signal out is obtained from this node. A first input signal in1 (voltage Vin1) is inputted to a source region of the p-channel transistor 1102 and a second input signal in2 (voltage Vin2) is inputted to a source region of the p-channel transistor 1101. The first level shifter circuit 1108 is connected to a gate electrode of the p-channel transistor 1101 and the source region of the p-channel transistor 1102. The second level shifter circuit 1109 is connected to a gate electrode of the p-channel transistor 1102 and the source region of the p-channel transistor 1101.

Figure 12:
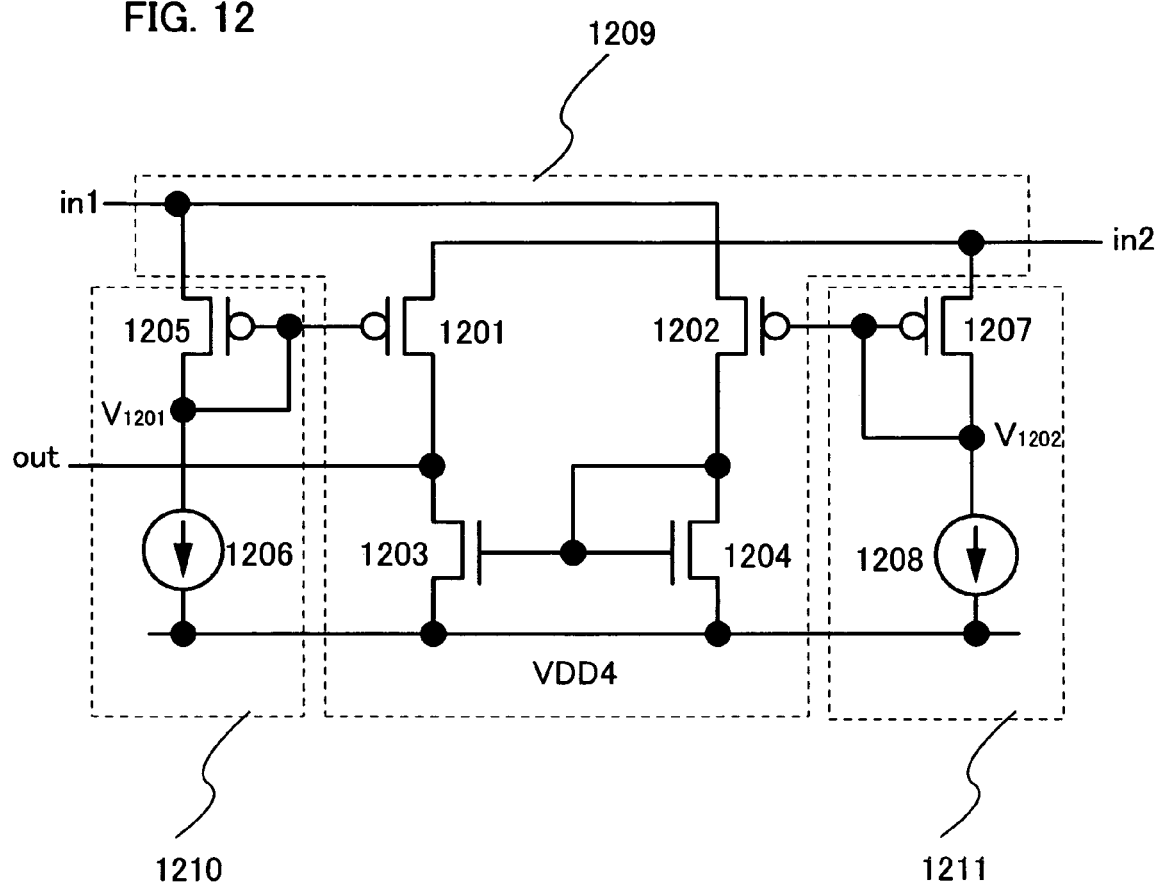
FIG. 12 shows a circuit diagram showing an example of a level shifter described in Embodiment Mode 4.

Here, description is made with reference to FIG. 12 on the case of using the semiconductor device of this embodiment mode as a level shifter. FIG. 12 is a specific diagram of the first level shifter circuit 1108 and the second level shifter circuit 1109. It is to be noted that each of the first and second input signals has amplitude of a difference between the voltage level VSS1 and the voltage level VSS2. The first wire 1105 and the second wire 1106 are both applied a power source potential VSS3. An inverted signal of the first input signal is inputted as the second input signal. Here, the power source potentials are set so as to satisfy VSS3<VSS2<VSS1.

The level shifter of this embodiment mode is formed of a differential circuit portion 1209, a first level shifter circuit 1210, and a second level shifter circuit 1211. The differential circuit portion 1209 is formed of a p-channel transistor 1201, a p-channel transistor 1202, an n-channel transistor 1203, and an n-channel transistor 1204. The first level shifter circuit 910 is formed of the current source 905 and the n-channel transistor 906. The first level shifter circuit 1210 is formed of a p-channel transistor 1205 and a current source 1206. A gate electrode of the p-channel transistor 1205 and a gate electrode of the p-channel transistor 1201 included in the differential circuit portion 1209 are connected to each other and to a drain region of the p-channel transistor 1205 and the current source 1206. The second level shifter circuit 1211 is formed of a p-channel transistor 1207 and a current source 1208. A gate electrode of the p-channel transistor 1207 and a gate electrode of the p-channel transistor 1202 included in the differential circuit portion 1209 are connected to each other and to a drain region of the p-channel transistor 1207 and the current source 1208. As for an input signal, the first input signal in1 (voltage Vin1) is inputted to source regions of the p-channel transistor 1202 included in the differential circuit portion 1209 and the p-channel transistor 1205 included in the first level shifter circuit 1210. The second input signal in2 (voltage Vin2) is inputted to source regions of the p-channel transistor 1201 included in the differential circuit portion 1209 and the p-channel transistor 1207 included in the second level shifter circuit 1211.

Next, description is made on a basic operation of the level shifter of this embodiment mode.

First, a signal with amplitude of a difference between the voltage level VSS1 and the voltage level VSS2 is inputted as the first input signal in1 to source regions of the p-channel transistor 1202 and the p-channel transistor 1205. A signal with amplitude of a difference between the voltage level VSS1 and the voltage level VSS2 is inputted as the second input signal to the source regions of the p-channel transistor 1201 and the p-channel transistor 1207. Accordingly, each of source potentials of the p-channel transistor 1202 and the p-channel transistor 1205 becomes Vin1 and each of source potentials of the p-channel transistor 1201 and the p-channel transistor 1207 becomes Vin2.

Next, description is made on operations of the first level shifter circuit 1210 and the second level shifter circuit 1211. Each of the p-channel transistor 1205 and the p-channel transistor 1207 has a gate electrode and a drain electrode connected to each other; therefore, the p-channel transistor 1205 and the p-channel transistor 1207 both operate in a saturation region. Accordingly, a potential obtained by resistance division of a voltage between VSS3 and Vin2 is inputted to the gate electrode of the p-channel transistor 1201. This potential is expressed as $V_{1201}$. Similarly, a potential obtained by resistance division of a voltage between VSS3 and Vin1 is inputted to the gate electrode of the p-channel transistor 1202. This potential is expressed as $V_{1202}$.

When the first input signal in1 is a High signal, the second input signal becomes a Low signal. Therefore, the input potentials $V_{1201}$ and $V_{1202}$ to the differential circuit portion 1209 are set so as to satisfy $V_{1201} > V_{1202}$. Further, the source potential of the p-channel transistor 1201 becomes VSS2 and the source potential of the p-channel transistor 1202 becomes VSS1; therefore, a gate-source voltage of the p-channel transistor 1201 becomes low while a gate-source voltage of the p-channel transistor 1202 becomes high. Accordingly, a potential of the output signal out falls to VSS3 due to the differential circuit portion 1209.

It is to be noted that a basic operation of the differential circuit portion 1209 is the same as that of the level shifter described in Embodiment Mode 2 (FIG. 5); therefore, detailed description thereof is omitted here.

When the first input signal in1 is a Low signal, the second input signal becomes a High signal. Therefore, the input potentials $V_{1201}$ and $V_{1202}$ to the differential circuit portion 1209 are set so as to satisfy $V_{1201} < V_{1202}$. Further, the source potential of the p-channel transistor 1201 becomes VSS1 and the source potential of the p-channel transistor 1202 becomes VSS2; therefore, a gate-source voltage of the p-channel transistor 1201 becomes high while a gate-source voltage of the p-channel transistor 1202 becomes low. Accordingly, a potential of the output signal out rises to VSS1 due to the differential circuit portion 1209.

In this manner, an input signal with amplitude of a difference between the voltage level VSS1 and the voltage level VSS2 is converted into an output signal with amplitude of a difference between the voltage level VSS1 and the voltage level VSS3.

The level shifter of this embodiment mode can realize reduction in power consumption as well as suppressing distortion of an output wave by reducing the current when converting voltage amplitude. Further, by using the first level shifter circuit 1210 and the second level shifter circuit 1211, the gate potentials $V_{1201}$ and $V_{1202}$ applied to the p-channel transistor 1201 and the p-channel transistor 1202 can be set lower than the threshold voltage of each of the p-channel transistor 1201 and the p-channel transistor 1202. Therefore, an operation is possible even when the threshold voltage of each of the p-channel transistor 1201 and the p-channel transistor 1202 is lower than voltage amplitude of an input signal.

It is to be noted that the level shifter circuit shown in FIG. 12 uses a current source; however, the level shifter circuit of this embodiment mode is not limited to this. FIG. 10 shows examples of circuits which can be used as a level shifter circuit. It is to be noted that the circuits shown in FIG. 10 are examples of a level shifter and the invention is not limited to this.

Further, in this embodiment mode, an inverted signal of the first input signal is the second input signal; however, it is not limited to this. In the case of using as a differential circuit, any signal may be used as long as the potentials Vin1 and Vin2 of the two input signals have a difference. Further, a power source voltage is applied to the first wire 1105 and the second wire 1106; however, the invention is not limited to this. A signal from another circuit or a clock signal may be inputted thereto. Further, different potentials may be applied to the first wire 1105 and the second wire 1106.

EMBODIMENT MODE 5

The semiconductor device described in the aforementioned embodiment modes is used as a level shifter which fixes one of a low potential side or a high potential side of an input signal while shifting the other. In this embodiment mode, description is made with reference to FIG. 13 on the case where the semiconductor device is used as a level shifter which shifts both a low potential side and a high potential side of an input signal.

Figure 13A:
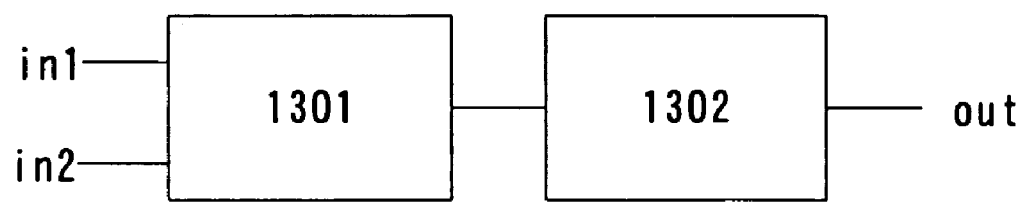
FIG. 13 shows schematic diagrams of a semiconductor device described in Embodiment Mode 5.
Figure 13B:
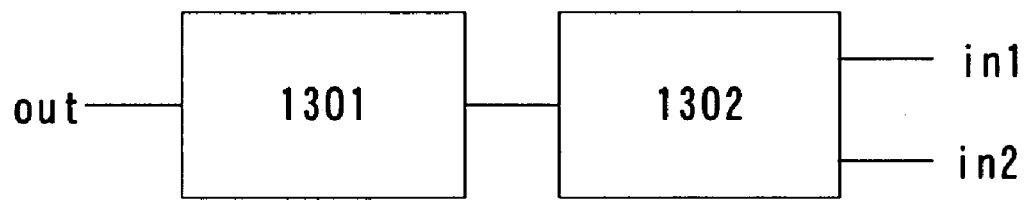

By using the semiconductor devices described in Embodiment Mode 1 and Embodiment Mode 2 in combination, a level shifter which shifts both a low potential side and a high potential side of an input signal can be formed. FIG. 13 shows schematic diagrams showing this embodiment mode. FIG. 13(A) shows the case where first and second input signals in1 and in2 are inputted to a high potential side level shifter 1301 first to shift a high potential side of the input signal, and then a low potential side level shifter 1302 is used to shift a low potential side of the input signal. On the contrary to FIG. 13(A), FIG. 13(B) shows the case where the first and second input signals in1 and in2 are inputted to the low potential side level shifter 1302 first to shift the low potential side of the input signal, and then the high potential side level shifter 1301 is used to shift the high potential side of the input signal. In this embodiment mode, the semiconductor device described in Embodiment Mode 1 can be used as the high potential side level shifter 1301 and the semiconductor device described in Embodiment Mode 2 can be used as the low potential side level shifter 1302.

Figure 14A:
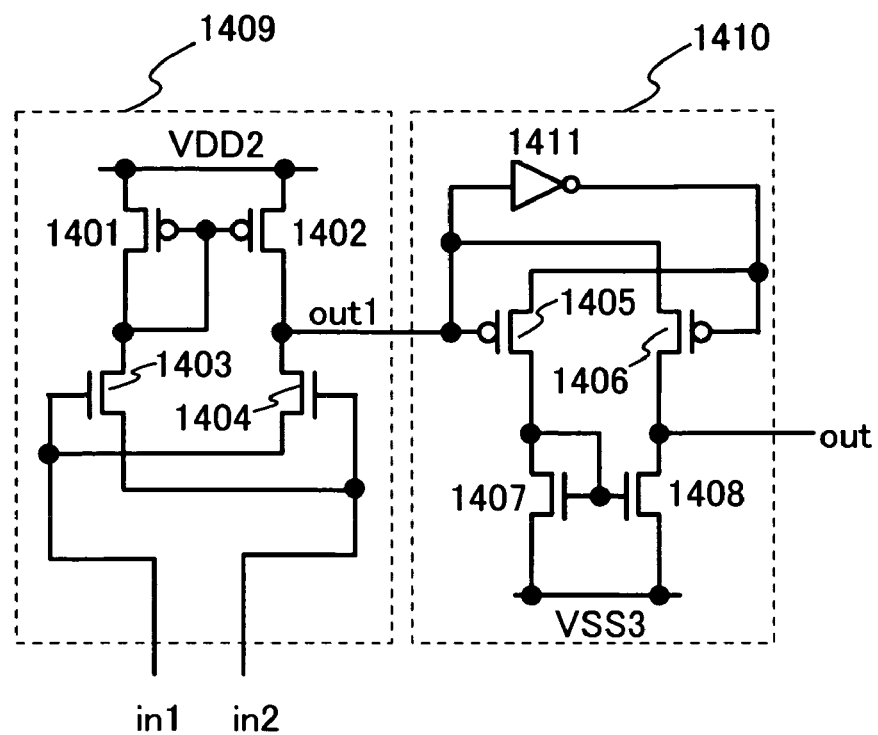
FIG. 14 shows circuit diagrams each showing an example of a level shifter described in Embodiment Mode 5.
Figure 14B:
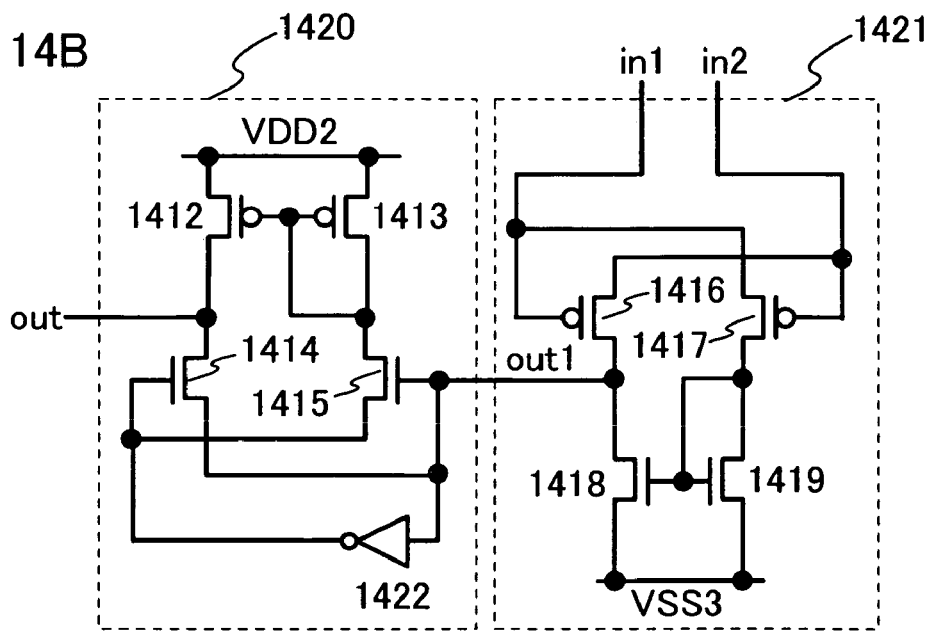

Here, description is made with reference to FIGS. 14(A) and 14(B) on an example where the semiconductor device described in Embodiment Mode 1 is used as the high potential side level shifter 1301 and the semiconductor device described in Embodiment Mode 2 is used as the low potential side level shifter 1302. FIG. 14(A) shows an example of a level shifter which shifts a low potential side after shifting a high potential side of an input signal while FIG. 14(B) shows an example of a level shifter which shifts a high potential side after shifting a low potential side of an input signal. It is to be noted in this embodiment mode that each of the first and second input signals has amplitude of a difference between the voltage level VSS1 and the voltage level VDD1, a power source potential of the high potential side is VDD2, a power source potential of the low potential side is VSS3, and an inverted signal of the first input signal is inputted as the second input signal. Here, the power source potentials are set so as to satisfy VSS3<VSS1<VDD1<VDD2.

First, description is made on the level shifter shown in FIG. 14(A), which shifts the low potential side after shifting the high potential side of the input signal.

The level shifter shown in FIG. 14(A) has a following configuration. A high potential side level shifter 1409 has a similar configuration to that of the semiconductor device (FIG. 1) described in Embodiment Mode 1 and a low potential side level shifter 1410 has a similar configuration to that of the semiconductor device (FIG. 5) described in Embodiment Mode 2. The high potential side level shifter 1409 has a p-channel transistor 1401, a p-channel transistor 1402, an n-channel transistor 1403, and an n-channel transistor 1404. The low potential side level shifter 1410 has a p-channel transistor 1405, a p-channel transistor 1406, an n-channel transistor 1407, an n-channel transistor 1408, and an inverter 1411.

In the high potential side level shifter 1409, a first input signal in1 is inputted to a gate electrode of the n-channel transistor 1403 and a source region of the n-channel transistor 1404. A second input signal in2 is inputted to a gate electrode of the n-channel transistor 1404 and a source region of the n-channel transistor 1403. A drain region of the p-channel transistor 1402 is connected to a drain region of the n-channel transistor 1404 and an output signal out1 is obtained from this node.

In the low potential side level shifter 1410, the output signal out1 of the high potential side level shifter 1409 is inputted to a gate electrode of the p-channel transistor 1405 and a source region of the p-channel transistor 1406. An inverted signal of the output signal out1 of the high potential side level shifter 1409 is inputted to a gate electrode of the p-channel transistor 1406 and a source region of the p-channel transistor 1405. A drain region of the p-channel transistor 1406 is connected to a drain region of the n-channel transistor 1408 and an output signal out is obtained from this node.

Next, description is made on a basic operation of the level shifter shown in FIG. 14(A).

First, description is made on the high potential side level shifter 1409. As the first input signal in1, a signal with amplitude of a difference between the voltage level VSS1 and the voltage level VDD1 is inputted to the gate electrode of the n-channel transistor 1403 and the source region of the n-channel transistor 1404. As the second input signal, a signal with amplitude of a difference between the voltage level VSS1 and the voltage level VDD1 is inputted to the gate electrode of the n-channel transistor 1404 and the source region of the n-channel transistor 1403. A basic operation of the high potential side level shifter 1409 is the same as that of the semiconductor device shown in FIG. 1; therefore, detailed description thereof is omitted here. At last, a signal with amplitude of a difference between the voltage level VSS1 and the voltage level VDD2 is obtained as the output signal out1.

Next, description is made on the low potential side level shifter 1410. The output signal out1 of the high potential side level shifter 1409 with amplitude of a difference between the voltage level VSS1 and the voltage level VDD2 is inputted to the gate electrode of the p-channel transistor 1405 and the source region of the p-channel transistor 1406. The output signal out1 of the high potential side level shifter 1409 with amplitude of a difference between the voltage level VSS1 and the voltage level VDD2 is inputted to the gate electrode of the p-channel transistor 1406 and the source region of the p-channel transistor 1405 through the inverter 1411. A basic operation of the low potential side level shifter 1410 is the same as the level shifter shown in FIG. 5; therefore, detailed description thereof is omitted here. At last, a signal with amplitude of a difference between the voltage level VSS3 and the voltage level VDD2 is obtained as the output signal out.

Next, description is made on the level shifter shown in FIG. 14(B) which shifts the high potential side after shifting the low potential side of the input signal.

The level shifter shown in FIG. 14(B) has a following configuration. A high potential side level shifter 1420 has a similar configuration to the semiconductor device (FIG. 1) described in Embodiment Mode 1 and a low potential side level shifter 1421 has a similar configuration to the semiconductor device (FIG. 5) described in Embodiment Mode 2. The high potential side level shifter 1420 includes a p-channel transistor 1412, a p-channel transistor 1413, an n-channel transistor 1414, an n-channel transistor 1415, and an inverter 1422. The low potential side level shifter 1421 includes a p-channel transistor 1416, a p-channel transistor 1417, an n-channel transistor 1418, and an n-channel transistor 1419.

In the low potential side level shifter 1421, the first input signal in1 is inputted to a gate electrode of the p-channel transistor 1416 and a source region of the p-channel transistor 1417. The second input signal in2 is inputted to a gate electrode of the p-channel transistor 1417 and a source region of the p-channel transistor 1416. A drain region of the n-channel transistor 1418 is connected to a drain region of the p-channel transistor 1416 and an output signal out1 is obtained from this node.

In the high potential side level shifter 1420, the output signal out1 of the low potential side level shifter 1421 is inputted to a gate electrode of the n-channel transistor 1415 and a source region of the n-channel transistor 1414. An inverted signal of the output signal out1 of the low potential side level shifter 1421 is inputted to a gate electrode of the n-channel transistor 1414 and a source region of the n-channel transistor 1415. A drain region of the p-channel transistor 1412 is connected to a drain region of the n-channel transistor 1414 and an output signal out is obtained from this node.

Next, description is made on a basic operation of the level shifter shown in FIG. 14(B).

First, description is made on the low potential side level shifter 1421. As the first input signal in1, a signal with amplitude of a difference between the voltage level VSS1 and the voltage level VDD1 is inputted to the gate electrode of the p-channel transistor 1416 and the source region of the p-channel transistor 1417. As the second input signal, a signal with amplitude of a difference between the voltage level VSS1 and the voltage level VDD1 is inputted to the gate electrode of the p-channel transistor 1417 and the source region of the p-channel transistor 1416. A basic operation of the low potential side level shifter 1421 is as described above; therefore, detailed description thereof is omitted here. At last, a signal with amplitude of a difference between the voltage level VSS3 and the voltage level VDD1 is obtained as an output signal out1.

Next, description is made on the high potential side level shifter 1420. The output signal out1 of the low potential side level shifter 1421 with amplitude of a difference between the voltage level VSS3 and the voltage level VDD1 is inputted to the gate electrode of the n-channel transistor 1415 and the source region of the n-channel transistor 1414. The output signal out1 of the low potential side level shifter 1421 with amplitude of a difference between the voltage level VSS3 and the voltage level VDD1 is inputted to the gate electrode of the n-channel transistor 1414 and the source region of the n-channel transistor 1415 through the inverter 1422. A basic operation of the high potential side level shifter 1420 is as described above; therefore, detailed description thereof is omitted here. At last, a signal with amplitude of a difference between the voltage level VSS3 and the voltage level VDD2 is obtained as the output signal out.

In this manner, by using the level shifter of this embodiment mode, a signal with amplitude of a difference between the voltage level VSS3 and the voltage level VDD1 can be converted into a signal with amplitude of a difference between the voltage level VSS3 and the voltage level VDD2.

It is to be noted in this embodiment mode that the semiconductor device described in Embodiment Mode 1 is used as the high potential side level shifter and the semiconductor device described in Embodiment Mode 2 is used as the low potential side level shifter; however, circuits used as the high potential side and low potential side level shifters are not limited to these. The semiconductor device described in other embodiment modes may be used as well. Further, a conventional level shifter circuit and the semiconductor device described in other embodiment modes may be used in combination.

EMBODIMENT MODE 6

In this embodiment mode, in a display device having a signal line driver circuit, a scan line driver circuit, or a display element, description is made on an example of mounting the semiconductor device of the invention to the signal line driver circuit or the scan line driver circuit.

Figure 15A:
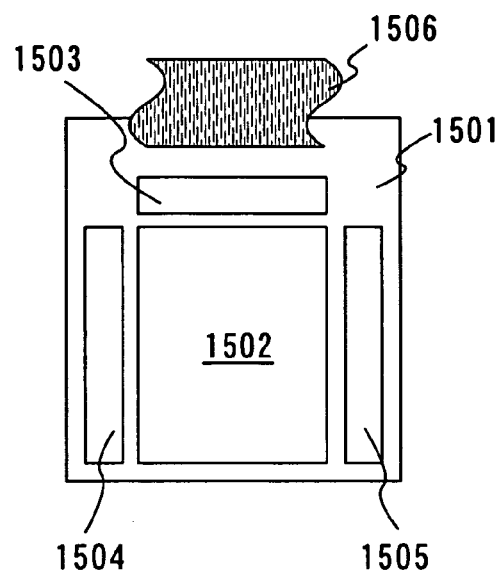
FIG. 15 shows diagrams each showing an example of a configuration of a display device described in Embodiment Mode 6.

FIG. 15(A) shows a display device which has over a substrate 1501 a pixel portion 1502 in which a plurality of pixels are arranged in matrix, a signal line driver circuit 1503, a first scan line driver circuit 1504, and a second scan line driver circuit 1505 in the periphery of the pixel potion 1502. The display device shown in FIG. 15(A) has the signal line driver circuit 1503 and the two scan line driver circuits (the first scan line driver circuit 1504 and the second scan line driver circuit 1505); however, this embodiment mode is not limited to this and the number of the signal line driver circuit and the scan line driver circuit can be appropriately determined in accordance with a pixel configuration. Further, signals are externally inputted through an FPC 1506 to the signal line driver circuit 1503 and the two scan line driver circuits (the first scan line driver circuit 1504 and the second scan line driver circuit 1505). However, this embodiment mode is not limited to this and a signal may be externally inputted by using an IC and the like to a semiconductor device besides the pixel portion.

Figure 15B:
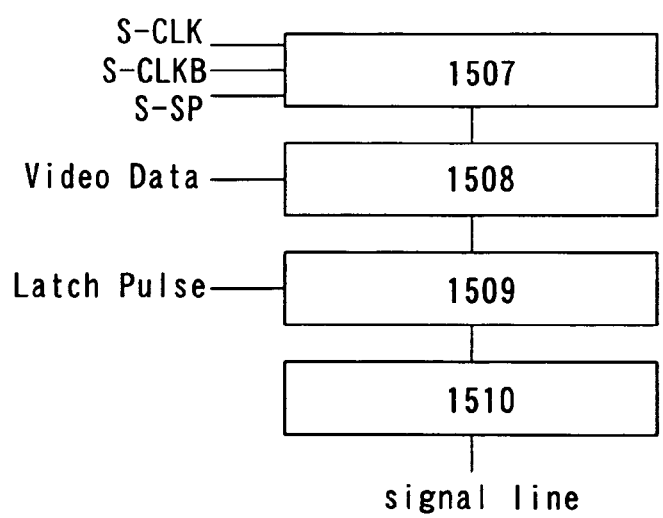

First, description is made with reference to FIG. 15(B) on the signal line driver circuit 1503. FIG. 15(B) shows a configuration of the signal line driver circuit 1503. The signal line driver circuit 1503 includes a shift register 1507, a first latch circuit 1508, a second latch circuit 1509, and a level shifter circuit 1510.

Next, description is briefly made on an operation of the signal line driver circuit 1503. The shift register 1507 is formed by using a plurality of columns of flip-flop circuits (FF) and the like and a clock signal (S-CLK), a start pulse (S-SP), and a clock inverting signal (S-CLKB) are inputted thereto. Sampling pulses are sequentially outputted in accordance with the timing of these signals.

The sampling pulses outputted from the shift register 1507 are inputted to the first latch circuit 1508. A video signal (Video Data) is inputted to the first latch circuit 1508, thereby video signals are held in each column in accordance with the timing at which the sampling pulses are inputted.

After the video signals are held up to the last column in the first latch circuit 1508, a latch pulse (Latch Pulse) is inputted to the second latch circuit 1509 during a horizontal flyback period. The video signals held in the first latch circuit 1508 are transferred to the second latch circuit 1509 all at once. After that, the video signals held in the second latch circuit 1509 are inputted to the level shifter circuit 1510 one row at a time, where a voltage thereof is amplified and sent to a signal line.

Figure 15C:
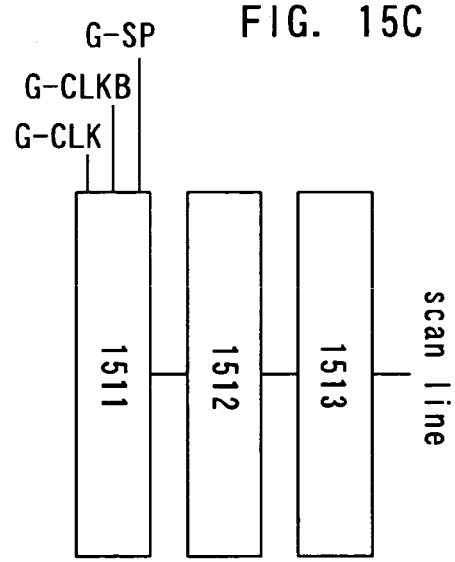

Next, description is made with reference to FIG. 15(C) on the first scan line driver circuit 1504 and the second scan line driver circuit 1505. FIG. 15(C) shows configurations of the first scan line driver circuit 1504 and the second scan line driver circuit 1505. Each of the first scan line driver circuit 1504 and the second scan line driver circuit 1505 includes a shift register 1511, a level shifter circuit 1512, and a buffer 1513.

Next, description is briefly made on operations of the first scan line driver circuit 1504 and the second scan line driver circuit 1505. The shift register 1511 is formed by using a plurality of columns of flip-flop circuits (FF) and the like and a clock signal (G-CLK), a start pulse (G-SP), and a clock inverting signal (G-CLKB) are inputted thereto. Sampling pulses are sequentially outputted in accordance with timing of these signals. After that, the sampling pulses amplified by the level shifter circuit 1512 and the buffer 1513 are inputted to the scan line, which are selected row by row.

Figure 16B:
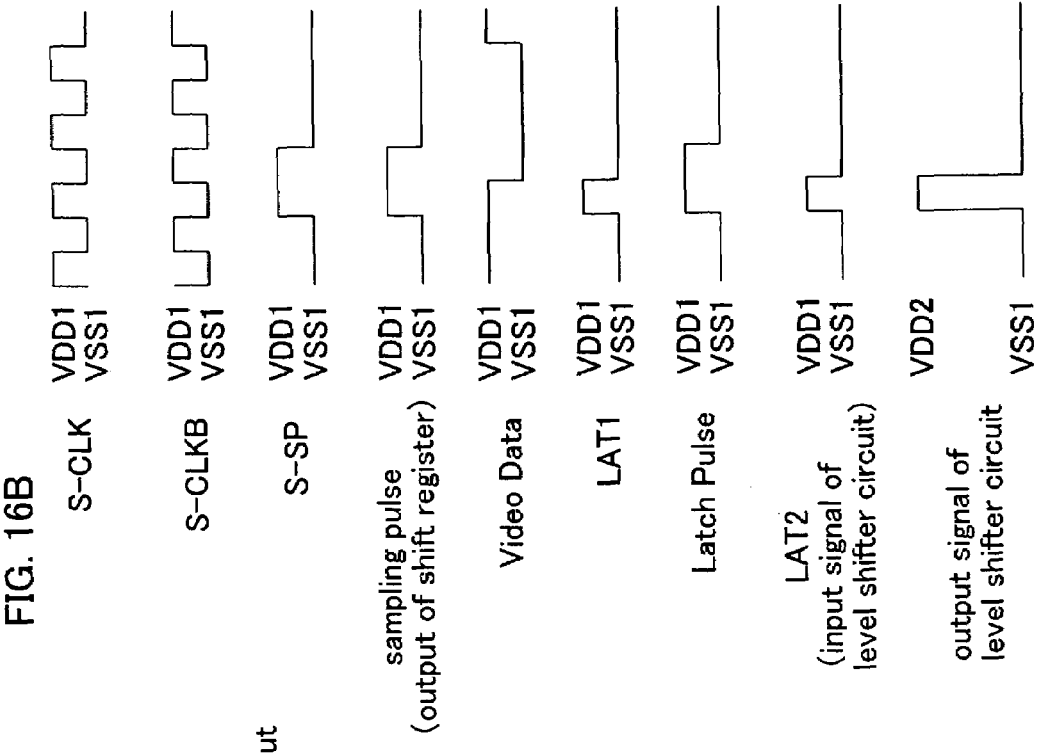
FIG. 16 shows circuit diagrams each showing an example of a signal line driver circuit described in Embodiment Mode 6.
Figure 16A:
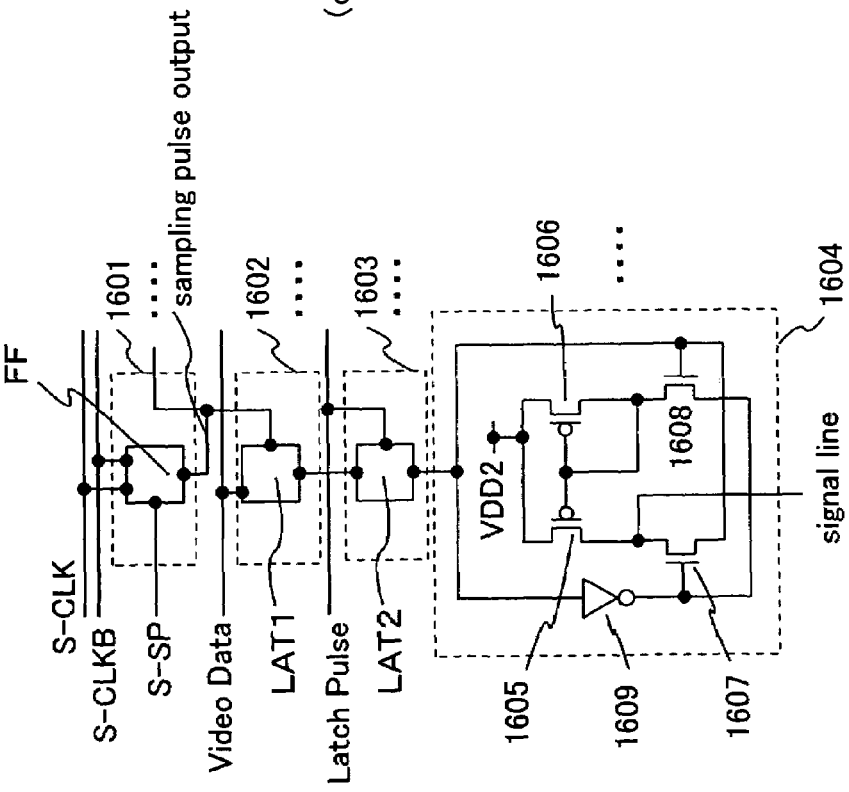

Here, description is made with reference to FIG. 16 on the case where the semiconductor device of the invention is mounted as the level shifter circuit 1510 of the signal line driver circuit 1503. FIG. 16(A) is a circuit diagram of one column of the signal line driver circuit 1503 of this embodiment mode. A level shifter circuit shown in FIG. 16(A) is the level shifter circuit described in Embodiment Mode 1. A level shifter circuit 1604 includes a p-channel transistor 1605, a p-channel transistor 1606, an n-channel transistor 1607, an n-channel transistor 1608, and an inverter 1609. A video signal outputted from a second latch circuit 1603 is inputted to a gate electrode of the n-channel transistor 1607 of the level shifter circuit 1604 through the inverter 1609 and a video signal outputted from a second latch circuit 1603 is inputted to a gate electrode of the n-channel transistor 1608, thereby an output signal out is obtained from a drain region of the n-channel transistor 1607. An operation of the level shifter circuit 1604 is as described above; therefore, description thereof is omitted here. At last, voltage amplitude of the video signal outputted from the second latch circuit 1603 can be amplified.

FIG. 16(B) shows an example of a timing chart of the signal line driver circuit of this embodiment mode. FIG. 16(B) shows an example where each of a clock signal (S-CLK), a start pulse (S-SP), a clock inverting signal (S-CLKB), a video signal (Video Data), and a latch pulse (Latch Pulse) has amplitude of a difference between the voltage level VSS1 and the voltage level VDD1. A signal inputted to the level shifter circuit 1604 through the shift register 1601, the first latch circuit 1602, and the second latch circuit 1603 is a signal which is High for a short period. On the other hand, a current flows when a High signal is inputted to a gate electrode of the n-channel transistor 1608 in the level shifter circuit 1604 used in this embodiment mode. Therefore, by connecting the inverter 1609 to a gate electrode of the n-channel transistor 1607, time during which a High signal is inputted to the gate electrode of the n-channel transistor 1608 can be drastically reduced, which leads to realize reduction in current and power consumption.

Figure 17A:
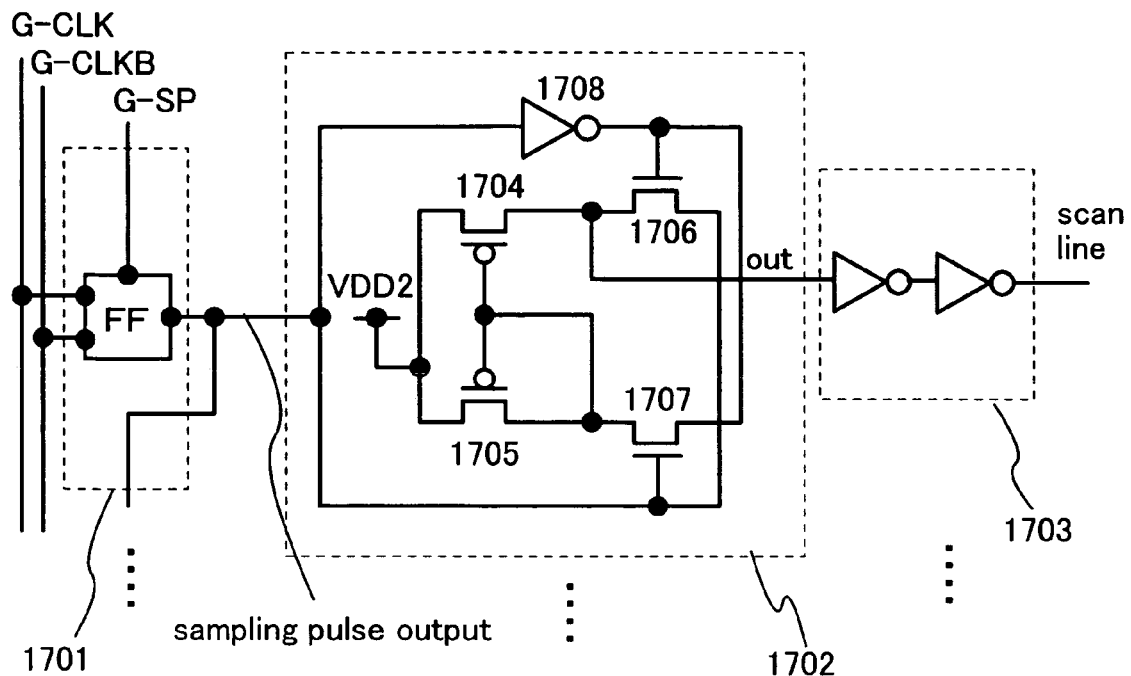
FIG. 17 shows circuit diagrams each showing an example of a scan line driver circuit described in Embodiment Mode 6.

Next, description is made with reference to FIG. 17 on the case where the semiconductor device of the invention is mounted as a level shifter circuit 1510 and a level shifter circuit 1512 of the first scan line driver circuit 1504 and the second scan line driver circuit 1505 respectively. FIG. 17(A) is a circuit diagram of one row of the first scan line driver circuit 1504 and the second scan line driver circuit 1505 of this embodiment mode. A level shifter circuit shown in FIG. 17(A) is the level shifter circuit described in Embodiment Mode 1. A level shifter circuit 1702 includes a p-channel transistor 1704, a p-channel transistor 1705, an n-channel transistor 1706, an n-channel transistor 1707, and an inverter 1708. Sampling pulses outputted from the shift register 1701 are inputted to a gate electrode of the n-channel transistor 1706 of the level shifter circuit 1702 through the inverter 1708 and the sampling pulses outputted from the shift register 1701 are inputted to a gate electrode of the n-channel transistor 1707, thereby an output signal out is obtained from a drain region of the n-channel transistor 1706 and inputted to the buffer 1703. An operation of the level shifter circuit 1702 is as described above; therefore, description thereof is omitted here. At last, voltage amplitude of the sampling pulses outputted from the shift register 1701 can be amplified.

Figure 17B:
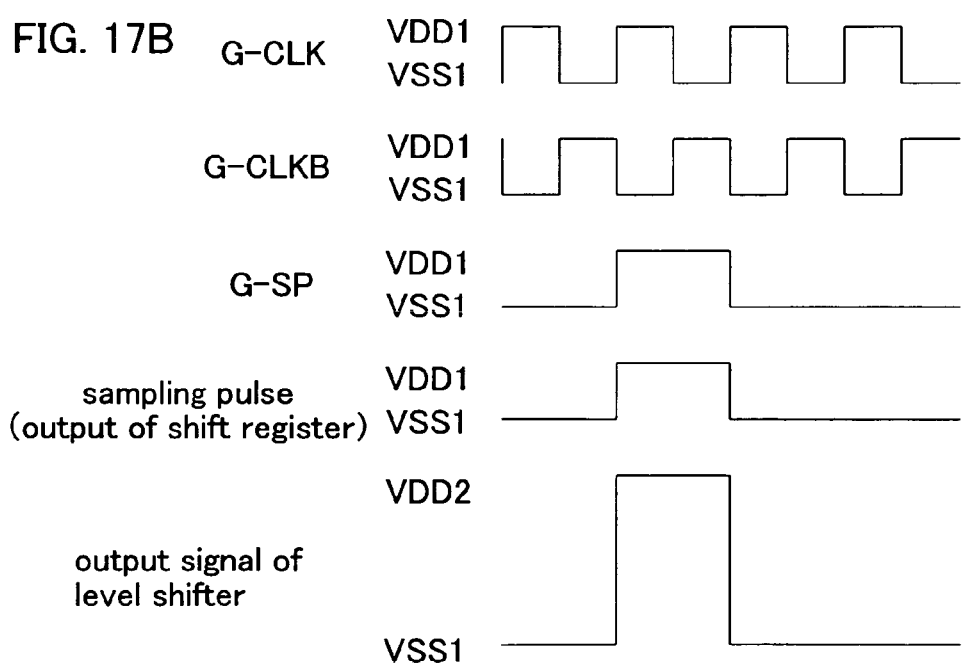

FIG. 17(B) shows an example of a timing chart of the scan line driver circuit of this embodiment mode. FIG. 17(B) shows an example where each of a clock signal (G-CLK), a start pulse (G-SP), and a clock inverting signal (G-CLKB) has amplitude of a difference between the voltage level VSS1 and the voltage level VDD1. A signal inputted to the level shifter circuit 1702 through the shift register 1701 is a signal which is High for a short period. On the other hand, a current flows when a High signal is inputted to a gate electrode of the n-channel transistor 1707 in the level shifter circuit 1702 used in this embodiment mode. Therefore, by connecting the inverter 1708 to a gate electrode of the n-channel transistor 1706, time during which a High signal is inputted to the gate electrode of the n-channel transistor 1707 can be drastically reduced, which leads to realize reduction in current and power consumption.

Further, by mounting the level shifter circuit of the invention, time during which a current flows to the level shifter when converting voltage amplitude can be reduced, which leads to suppress distortion of an output wave.

It is to be noted in this embodiment mode that the level shifter circuit of the invention is used as the level shifter circuit 1510 and the level shifter circuit 1512 of the signal line driver circuit and the scan line driver circuit as an example; however, the level shifter circuit of the invention may be used for other parts of the signal line driver circuit and the scan line driver circuit.

Figure 20A:
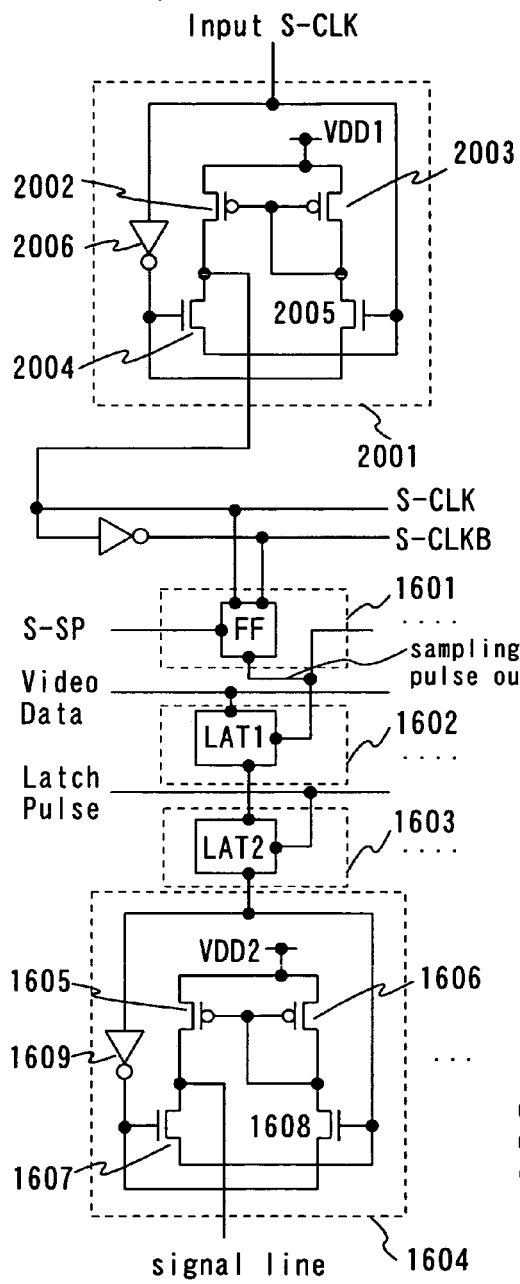
FIG. 20 shows circuit diagrams each showing an example of a signal line driver circuit described in Embodiment mode 6.
Figure 20B:
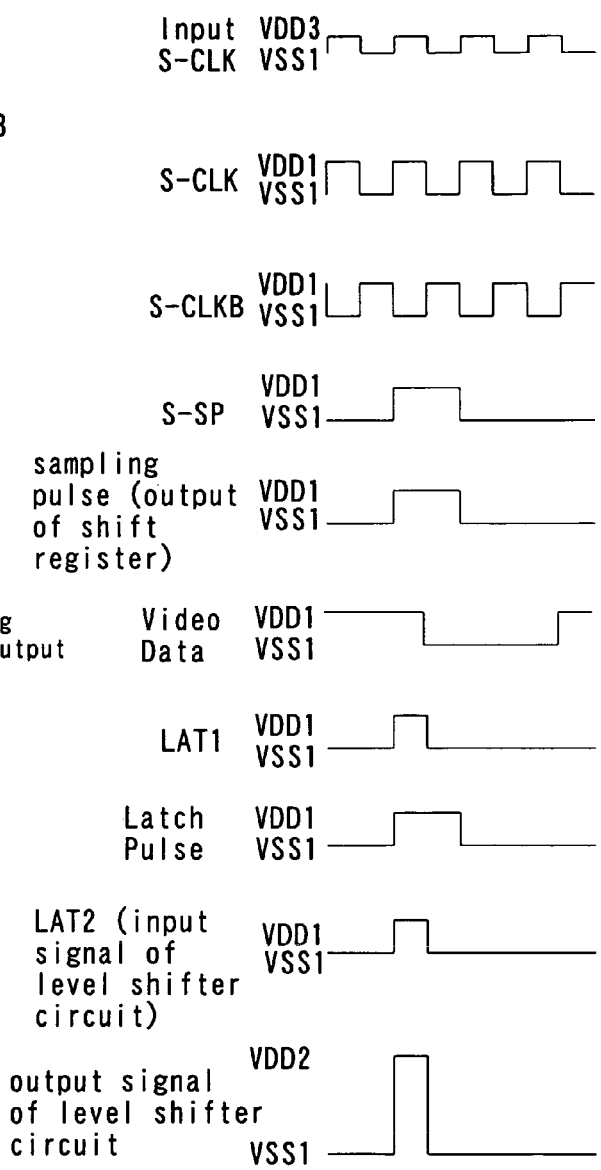
Figure 21A:
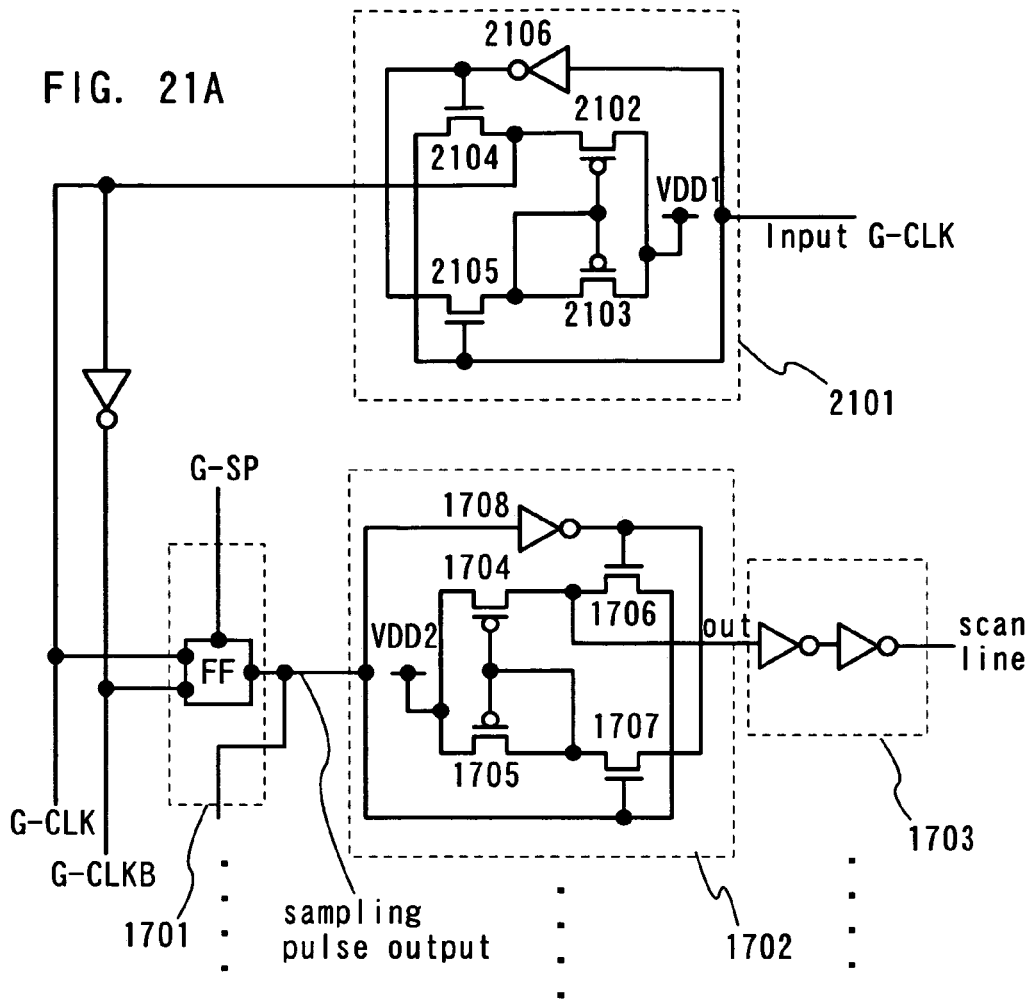
FIG. 21 shows circuit diagrams each showing an example of a scan line driver circuit described in Embodiment mode 6.
Figure 21B:
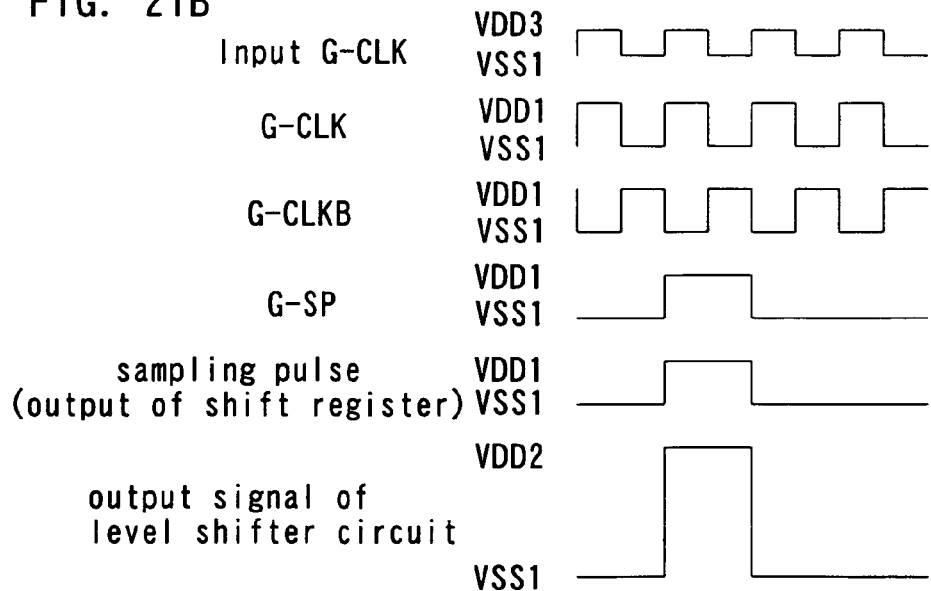

For example, the level shifter circuit of the invention may be used as an amplifier circuit of a clock signal inputted to the signal line driver circuit and the scan line driver circuit. FIGS. 20 and 21 show these examples.

FIG. 20 shows an example where the level shifter circuit of the invention is used as an amplifier circuit of a clock signal inputted to the signal line driver circuit. A first level shifter circuit 2001 includes a p-channel transistor 2002, a p-channel transistor 2003, an n-channel transistor 2004, an n-channel transistor 2005, and an inverter 2006. A clock signal (Input S-CLK) with amplitude of a difference between the voltage level VSS1 and the voltage level VDD3 is inputted to the first level shifter circuit 2001, thereby a clock signal (S-CLK) with amplitude of a difference between the voltage level VSS1 and the voltage level VDD1 is generated. Here, the power source voltages are set so as to satisfy VSS1<VDD3<VDD1.

FIG. 21 shows an example where the level shifter circuit of the invention is used as an amplifier circuit of a clock signal inputted to the scan line driver circuit. A first level shifter circuit 2101 includes a p-channel transistor 2102, a p-channel transistor 2103, an n-channel transistor 2104, an n-channel transistor 2105, and an inverter 2106. A clock signal (Input G-CLK) with amplitude of a difference between the voltage level VSS1 and the voltage level VDD3 is inputted to the first level shifter circuit 2101, thereby a clock signal (G-CLK) with amplitude of a difference between the voltage level VSS1 and the voltage level VDD1 is generated. Here, the power source voltages are set so as to satisfy VSS1<VDD3<VDD1.

In this manner, by using the level shifter circuit of the invention as an amplifier circuit of a clock signal inputted to the signal line driver circuit and the scan line driver circuit, voltage amplitude of the clock signal (Input S-CLK and Input G-CLK) can be reduced. Therefore, load on a wire which sends the clock signal can be reduced, and at the same time, power consumption can be reduced as well. Further, time during which a current flows to the level shifter when converting voltage amplitude can be reduced; therefore, distortion of an output wave can be suppressed.

It is to be noted that the semiconductor device (FIG. 1) described in Embodiment Mode 1 is used in this embodiment mode; however, a circuit used as the level shifter circuit is not limited to this. The semiconductor device described in other embodiment modes may be used as well.

Further, the display element used for the semiconductor device described in this embodiment mode is not limited. The invention can be applied to a liquid crystal display device using liquid crystals, an EL display device which emits light by electroluminescence (Electro Luminescence:

EL) using inorganic or organic material, a display device using a Digital Micromirror Device (DMD) element, a field emission display (Field Emission Display: FED), a surface-conduction electron-emitter display (Surface-conduction Electron-emitter Display: SED), electronic paper, and the like.

EMBODIMENT MODE 7

In this embodiment mode, description is made with reference to FIG. 18 on an example where the semiconductor device of the invention is applied to an operational amplifier.

Figure 18A:
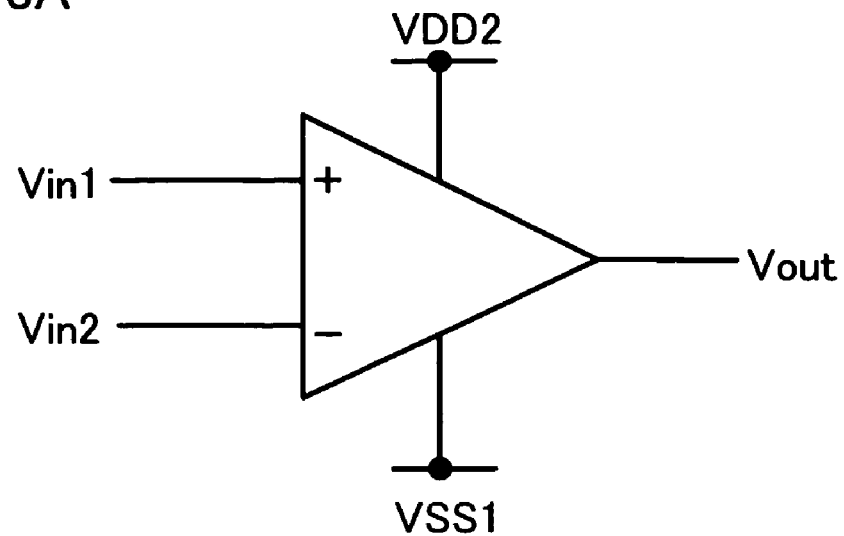
FIG. 18 shows circuit diagrams each showing an example of an operational amplifier described in Embodiment Mode 7.

FIG. 18(A) shows a circuit symbol of an operational amplifier. An operational amplifier has a function to output an amplified output potential Vout relatively to a first input potential Vin1 and a second input potential Vin2. There are various circuit configurations for an operational amplifier although it is mainly formed of a differential circuit and an amplifier circuit. In this embodiment mode, description is made on an example where the semiconductor device of the invention is employed as a differential circuit and used in combination with a common source circuit to be used as an amplifier circuit. It is to be noted that the power source potentials VSS1 and VDD2 are used, which satisfy VSS1<VDD2.

Figure 18B:
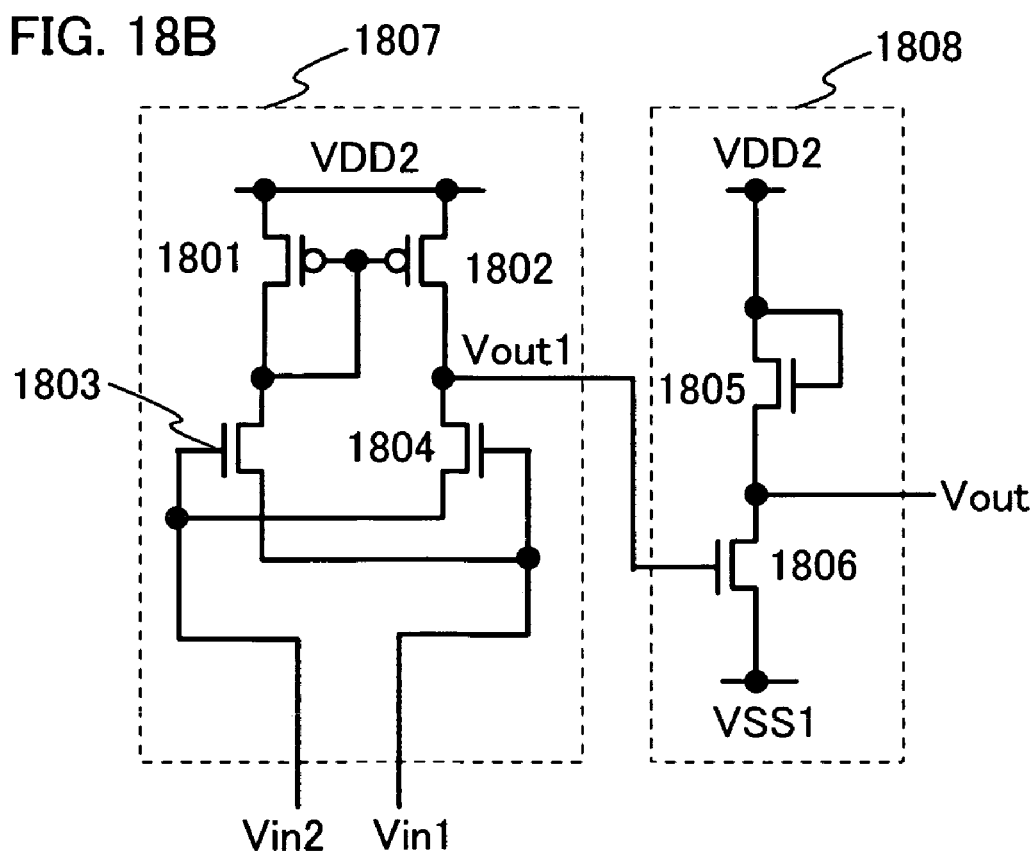

FIG. 18(B) is a circuit diagram of an operational amplifier of this embodiment mode. The operational amplifier of this embodiment mode has a following configuration.

The operational amplifier of this embodiment mode is formed of a differential circuit 1807 and an amplifier circuit 1808. The semiconductor device (FIG. 1) described in Embodiment Mode 1 is applied as the differential circuit 1807. The differential circuit 1807 is formed of a p-channel transistor 1801, a p-channel transistor 1802, an n-channel transistor 1803, and an n-channel transistor 1804. The first input potential Vin1 is applied to a gate electrode of the n-channel transistor 1804 and a source region of the n-channel transistor 1803. The second input potential Vin2 is applied to a gate electrode of the n-channel transistor 1803 and a source region of the n-channel transistor 1804. A drain region of the n-channel transistor 1804 is connected to a drain region of the p-channel transistor 1802 and an output potential Vout1 is obtained from this node.

An amplifier circuit 1808 is a common source circuit formed of an n-channel transistor 1805 and an n-channel transistor 1806. A drain region of the n-channel transistor 1805 is connected to a high potential power source (a power source potential VDD2). A gate electrode and the drain region of the n-channel transistor 1805 are connected to each other. A source region of the n-channel transistor 1806 is connected to a low potential power source (power source potential VSS1). The output potential Vout1 from the differential circuit 1807 is applied to a gate electrode of the n-channel transistor 1806. A drain region of the n-channel transistor 1806 is connected to a source region of the n-channel transistor 1805 and an output potential Vout is obtained from this node.

Next, description is made on a basic operation of the operational amplifier of this embodiment mode.

In the case where there is a difference between the first input potential Vin1 and the second input potential Vin2 in the differential circuit 1807, a current ($I_{1803}$-$I_{1804}$) which corresponds to a difference between the current $I_{1803}$ flowing through the n-channel transistor 1803 and the current $I_{1804}$ flowing through the n-channel transistor 1804 flows through an output terminal. Therefore, a potential due to the current of the difference is obtained as the output potential Vout1. In the case where the first input potential Vin1 and the second input potential Vin2 are set so as to satisfy Vin1>Vin2, the current $I_{1803}$ flowing through the n-channel transistor 1803 decreases while the current $I_{1804}$ flowing through the n-channel transistor 1804 increases. Accordingly, the output potential Vout1 falls.

Next, in the amplifier circuit 1808, as the gate electrode and the drain region of the n-channel transistor 1805 are connected to each other, the n-channel transistor 1805 operates in a saturation region. Therefore, an output potential Vout is a potential obtained by resistance division of a voltage between VDD2 and VSS1. In the case where the first input potential Vin1 and the second input potential Vin2 are set so as to satisfy Vin1>Vin2, the output potential Vout1 of the differential circuit 1807 falls, and thus a gate-source voltage of the n-channel transistor 1806 becomes low. Accordingly, the output potential Vout rises in accordance with the power source potential VDD2. It is to be noted that the larger the potential difference between the first input potential Vin1 and the second input potential Vin2 is, the closer to the power source potential VDD2 the output potential Vout becomes.

On the other hand, when the first input potential Vin1 and the second input potential Vin2 are set so as to satisfy Vin1<Vin2, the current $I_{1803}$ flowing through the n-channel transistor 1803 increases and the current $I_{1804}$ flowing through the n-channel transistor 1804 decreases in the differential circuit 1807. Therefore, the output potential Vout1 rises. Accordingly, a gate-source voltage of the n-channel transistor 1806 becomes high in the amplifier circuit 1808. Accordingly, the output potential Vout becomes low in accordance with the power source potential VSS1. It is to be noted that the larger the potential difference between the first input potential Vin1 and the second input potential Vin2 is, the closer to the power source potential VSS1 the output potential Vout becomes.

In this manner, the output potential Vout which is amplified between VSS1 and VDD2 is obtained relatively to the potential difference between the input potentials Vin1 and Vin2.

It is to be noted in this embodiment mode that the semiconductor device described in Embodiment Mode 1 is used as the differential circuit; however, a circuit used as the differential circuit is not limited to this. The semiconductor device described in other embodiment modes may be used as well. Further, a common source circuit is used as the amplifier circuit; however, a circuit used as the amplifier circuit is not limited to this.

EMBODIMENT MODE 8

Electronic devices using the semiconductor device of the invention include a video camera, a digital camera, a goggle type display (head mounted display), a navigation system, an audio reproducing device (car audio set, audio component set, and the like), a notebook type personal computer, a game machine, a portable information terminal (mobile computer, portable phone, portable game machine, electronic book, and the like), an image reproducing device provided with a memory medium (specifically a device which reproduces a memory medium such as a Digital Versatile Disc (DVD) and has a display capable of displaying the reproduced image), and the like. Specific examples of these electronic devices are shown in FIG. 19.

Figure 19A:
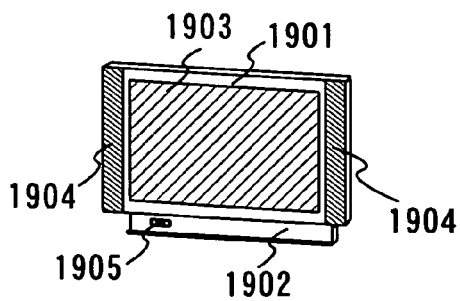
FIG. 19 shows diagrams each showing an example of an electronic device to which the invention is applied.

FIG. 19(A) illustrates a television including a housing 1901, a support base 1902, a display portion 1903, speaker portions 1904, a video input terminal 1905, and the like. The invention can be used for a semiconductor device which forms the display portion 1903. By using the semiconductor device of the invention, a television with reduced power consumption can be provided.

Figure 19B:
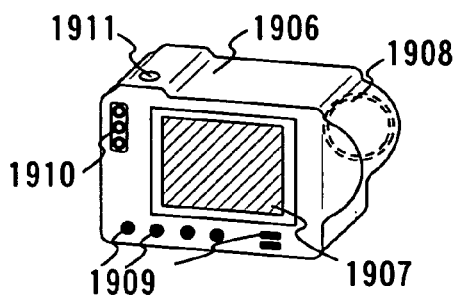

FIG. 19(B) illustrates a digital still camera including a main body 1906, a display portion 1907, an image receiving portion 1908, operating keys 1909, an external connecting port 1910, a shutter 1911, and the like. The invention can be used for a semiconductor device which forms the display portion 1907. By using the semiconductor device of the invention, a digital still camera with reduced power consumption can be provided.

Figure 19C:
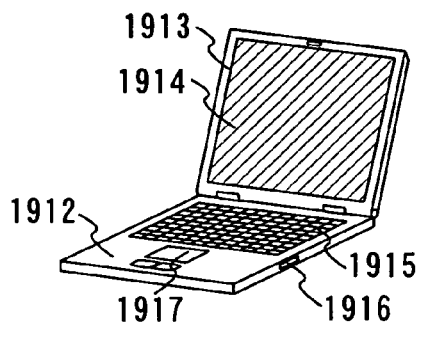

FIG. 19(C) illustrates a notebook type personal computer including a main body 1912, a housing 1913, a display portion 1914, a keyboard 1915, an external connecting port 1916, a pointing mouse 1917, and the like. The invention can be used for a semiconductor device which forms the display portion 1914. By using the semiconductor device of the invention, a notebook type personal computer with reduced power consumption can be provided.

Figure 19D:
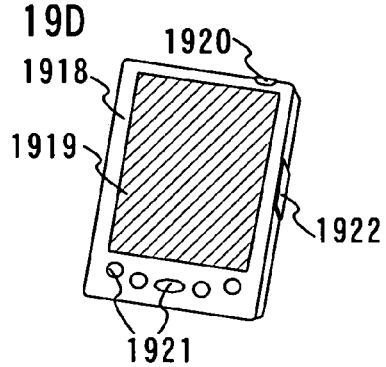

FIG. 19(D) illustrates a mobile computer including a main body 1918, a display portion 1919, a switch 1920, operating keys 1921, an infrared port 1922, and the like. The invention can be used for a semiconductor device which forms the display portion 1919. By using the semiconductor device of the invention, a mobile computer with reduced power consumption can be provided.

Figure 19E:
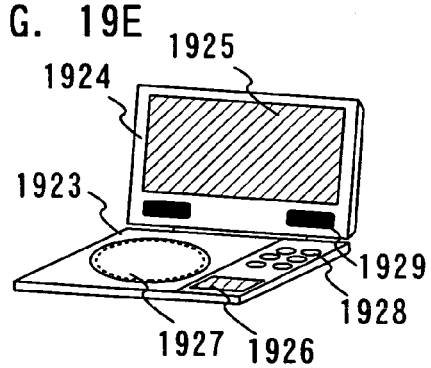

FIG. 19(E) illustrates a portable image reproducing device (specifically a DVD reproducing device) provided with a memory medium device, including a main body 1923, a housing 1924, a display portion A 1925, a display portion B 1926, a memory medium (DVD and the like) reading portion 1927, an operating key 1928, a speaker portion 1929, and the like. The display portion A 1925 mainly displays image data while the display portion B mainly displays text data. The invention can be used for a semiconductor device which forms the display portions A and B 1925 and 1926. It is to be noted that the image reproducing device provided with a recording medium includes a home game machine and the like. By using the semiconductor device of the invention, an image reproducing device with reduced power consumption can be provided.

Figure 19F:
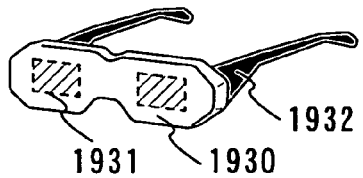

FIG. 19(F) illustrates a goggle type display (head mounted display) including a main body 1930, a display portion 1931, an arm portion 1932, and the like. The invention can be used for a semiconductor device which forms the display portion 1931. By using the semiconductor device of the invention, a goggle type display (head mounted display) with reduced power consumption can be provided.

Figure 19G:
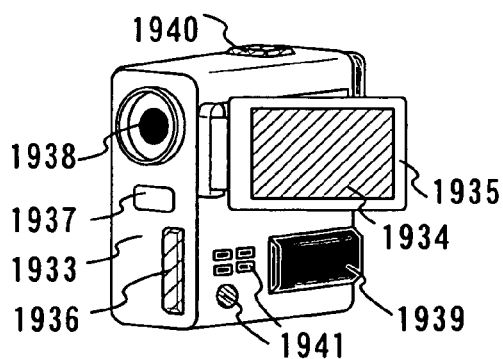

FIG. 19(G) illustrates a video camera including a main body 1933, a display portion 1934, a housing 1935, an external connecting port 1936, a remote control receiving portion 1937, an image receiving portion 1938, a battery 1939, an audio input portion 1940, operating keys 1941, and the like. The invention can be used for a semiconductor device which forms the display portion 1934. By using the semiconductor device of the invention, a video camera with reduced power consumption can be provided.

Figure 19H:
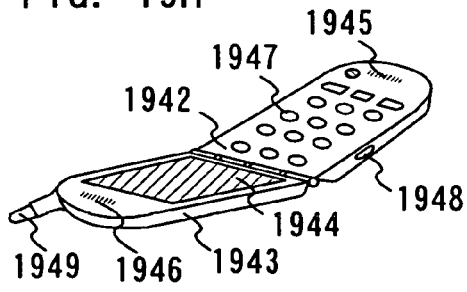

FIG. 19(H) illustrates a portable phone including a main body 1942, a housing 1943, a display portion 1944, an audio input portion 1945, an audio output portion 1946, an operating key 1947, an external connecting port 1948, an antenna 1949, and the like. The invention can be used for a semiconductor device which forms the display portion 1944. By using the semiconductor device of the invention, a portable phone with reduced power consumption can be provided.

As described above, the application range of the invention is quite wide and the invention can be applied to electronic devices of various fields.

What is claimed is:

1. A semiconductor device comprising:
   a first transistor having a gate electrode to which a first signal is inputted and a first terminal to which a second signal is inputted;
   a second transistor having a gate electrode to which the second signal is inputted and a first terminal to which the first signal is inputted;
   a third transistor having a first terminal to which a predetermined potential is inputted and a second terminal connected to the second terminal of the first transistor; and
   a fourth transistor having a gate electrode connected to a gate electrode of the third transistor, a first terminal to which a predetermined potential is inputted, a second terminal connected to a second terminal of the second transistor, the gate electrode and the second terminal thereof are connected to each other,
   wherein the first transistor and the second transistor are p-channel transistors and the third transistor and the fourth transistor are n-channel transistors,
   wherein the gate electrode of the first transistor is directly connected to the first terminal of the second transistor, and
   wherein the gate electrode of the second transistor is directly connected to the first terminal of the first transistor.

2. The semiconductor device according to claim 1, wherein the first terminal of each of the first transistor to the fourth transistor is one of a source or a drain, and
   wherein the second terminal is the other of the source or the drain.

3. A display device having the semiconductor device according to claim 1, comprising at least one of a signal line driver circuit, a scan line driver circuit, and a display element.

4. An electronic device comprising the semiconductor device according to claim 1.

5. A semiconductor device comprising:
   a first transistor;
   a second transistor;
   a third transistor; and
   a fourth transistor,
   wherein the first transistor and the second transistor are p-channel transistors, and the third transistor and the fourth transistor are n-channel transistors,
   wherein a gate electrode of the third transistor is connected to a gate electrode of the fourth transistor,
   wherein a first terminal of the third transistor is connected to a first wire,
   wherein a first terminal of the fourth transistor is connected to a second wire,
   wherein a second terminal of the fourth transistor is connected to the gate electrode of the fourth transistor,
   wherein a gate electrode of the first transistor is connected to a third wire,
   wherein a first terminal of the first transistor is connected to a fourth wire
   wherein a second terminal of the first transistor is connected to a second terminal of the third transistor,
   wherein a gate electrode of the second transistor is connected to the fourth wire,
   wherein a first terminal of the second transistor is connected to the third wire, wherein a second terminal of the second transistor is connected to the second terminal of the fourth transistor, wherein the pate electrode of the first transistor is directly connected to the first terminal of the second transistor, and wherein the pate electrode of the second transistor is directly connected to the first terminal of the first transistor.

6. The semiconductor device according to claim 5, wherein the third wire is connected to the gate electrode of the first transistor through a first level shifter circuit, and wherein the fourth wire is connected to the gate electrode of the second transistor through a second level shifter circuit.

7. The semiconductor device according to claim 5, wherein a first input signal is inputted to the third wire, and wherein a second input signal is inputted to the fourth wire.

8. The semiconductor device according to claim 5, wherein the first terminal of each of the first transistor to the fourth transistor is one of a source or a drain, and wherein the second terminal is the other of the source or the drain.

9. A display device having the semiconductor device according to claim 5, comprising at least one of a signal line driver circuit, a scan line driver circuit, and a display element.

10. An electronic device comprising the semiconductor device according to claim 5.

* * * * *